US011257983B2

(12) United States Patent
Schneider, Jr. et al.

(10) Patent No.: US 11,257,983 B2
(45) Date of Patent: Feb. 22, 2022

(54) LIGHT EMITTING DIODES FORMED ON NANODISK SUBSTRATES AND METHODS OF MAKING THE SAME

(71) Applicant: GLO AB, Lund (SE)

(72) Inventors: Richard P. Schneider, Jr., Albuquerque, NM (US); Benjamin Leung, Sunnyvale, CA (US); Fariba Danesh, Los Altos Hills, CA (US); Zulal Tezcan Ozel, Fremont, CA (US); Miao-Chan Tsai, Sunnyvale, CA (US)

(73) Assignee: NANOSYS, INC., Milpitas, CA (US)

( * ) Notice: Subject to any disclaimer, the term of this patent is extended or adjusted under 35 U.S.C. 154(b) by 141 days.

(21) Appl. No.: 16/461,256

(22) PCT Filed: Apr. 10, 2019

(86) PCT No.: PCT/US2019/026758
§ 371 (c)(1),
(2) Date: May 15, 2019

(87) PCT Pub. No.: WO2019/199946
PCT Pub. Date: Oct. 17, 2019

(65) Prior Publication Data
US 2020/0274029 A1    Aug. 27, 2020

Related U.S. Application Data

(60) Provisional application No. 62/656,194, filed on Apr. 11, 2018.

(51) Int. Cl.
*H01L 33/24* (2010.01)
*H01L 27/15* (2006.01)
(Continued)

(52) U.S. Cl.
CPC .......... *H01L 33/24* (2013.01); *H01L 25/0753* (2013.01); *H01L 27/156* (2013.01);
(Continued)

(58) Field of Classification Search
None
See application file for complete search history.

(56) References Cited

U.S. PATENT DOCUMENTS 8,669,574 B2    3/2014  Konsek et al.
9,281,442 B2    3/2016  Romano et al.
(Continued)

FOREIGN PATENT DOCUMENTS

KR    10-2009-0111711 A    10/2009
WO    WO2019/036439 A1    2/2019

OTHER PUBLICATIONS

Notification Concerning Transmittal of International Preliminary Report on Patentability and Written Opinion of the International Search Authority for International Patent Application No. PCT/US2019/026758, dated Oct. 22, 2020, 9 pages.
(Continued)

*Primary Examiner* — Nicholas J Tobergte
*Assistant Examiner* — Kien C Ly
(74) *Attorney, Agent, or Firm* — The Marbury Law Group PLLC

(57) ABSTRACT

A light emitting device, such as an LED, is formed by forming a plurality of semiconductor nanostructures having a doping of a first conductivity type through, and over, a growth mask layer overlying a doped compound semiconductor layer. Each of the plurality of semiconductor nanostructures includes a nanofrustum including a bottom surface, a top surface, tapered planar sidewalls, and a height that is less than a maximum lateral dimension of the top surface, and a pillar portion contacting the bottom surface of
(Continued)

the nanofrustum and located within a respective one of the openings through the growth mask layer. A plurality of active regions on the nanofrustums. A second conductivity type semiconductor material layer is formed on each of the plurality of active regions.

20 Claims, 36 Drawing Sheets

(51) Int. Cl.
*H01L 33/36* (2010.01)
*H01L 33/46* (2010.01)
*H01L 33/62* (2010.01)
*H01L 25/075* (2006.01)
*H01L 33/00* (2010.01)
*H01L 33/12* (2010.01)
*H01L 33/32* (2010.01)

(52) U.S. Cl.
CPC ............ *H01L 33/007* (2013.01); *H01L 33/12* (2013.01); *H01L 33/32* (2013.01); *H01L 33/36* (2013.01); *H01L 33/46* (2013.01); *H01L 33/62* (2013.01); *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| 9,419,183 B2 | 8/2016 | Lowgren et al. | |
| 9,444,007 B2 | 9/2016 | Kryliouk et al. | |
| 9,893,041 B2 | 2/2018 | Pokhriyal et al. | |
| 9,941,262 B2 | 4/2018 | Thompson | |
| 10,177,123 B2 | 1/2019 | Gardner et al. | |
| 10,193,038 B2 | 1/2019 | Farrens et al. | |
| 2003/0107047 A1* | 6/2003 | Okuyama | H01L 21/0254 257/95 |
| 2009/0114933 A1 | 5/2009 | Osawa et al. | |
| 2011/0254034 A1 | 10/2011 | Konsek et al. | |
| 2013/0248817 A1 | 9/2013 | Kim | |
| 2015/0188091 A1 | 7/2015 | Kudo et al. | |
| 2015/0207028 A1 | 7/2015 | Romano et al. | |
| 2015/0207033 A1* | 7/2015 | Kryliouk | H01L 33/0025 257/13 |
| 2015/0207037 A1 | 7/2015 | Lowgren et al. | |
| 2015/0333225 A1 | 11/2015 | Samuelson et al. | |
| 2017/0162552 A1 | 6/2017 | Thompson | |
| 2017/0236811 A1 | 8/2017 | Pokhriyal et al. | |
| 2017/0288102 A1 | 10/2017 | Farrens et al. | |
| 2017/0301660 A1 | 10/2017 | Pokhriyal et al. | |
| 2017/0373046 A1 | 12/2017 | Gardner et al. | |
| 2018/0114878 A1 | 4/2018 | Danesh et al. | |
| 2018/0198047 A1 | 7/2018 | Danesh et al. | |
| 2018/0351017 A1 | 12/2018 | Schneider et al. | |
| 2018/0366450 A1 | 12/2018 | Gardner et al. | |
| 2019/0088820 A1 | 3/2019 | Danesh et al. | |
| 2019/0109262 A1 | 4/2019 | Danesh et al. | |

OTHER PUBLICATIONS

U.S. Appl. No. 16/084,824, filed Sep. 13, 2018, Tezcan et al.
Notification of Transmittal of the International Search Report and Written Opinion of the International Search Authority for International Patent Application No. PCT/US2019/026758, dated Jul. 24, 2019, 14 pages.

* cited by examiner

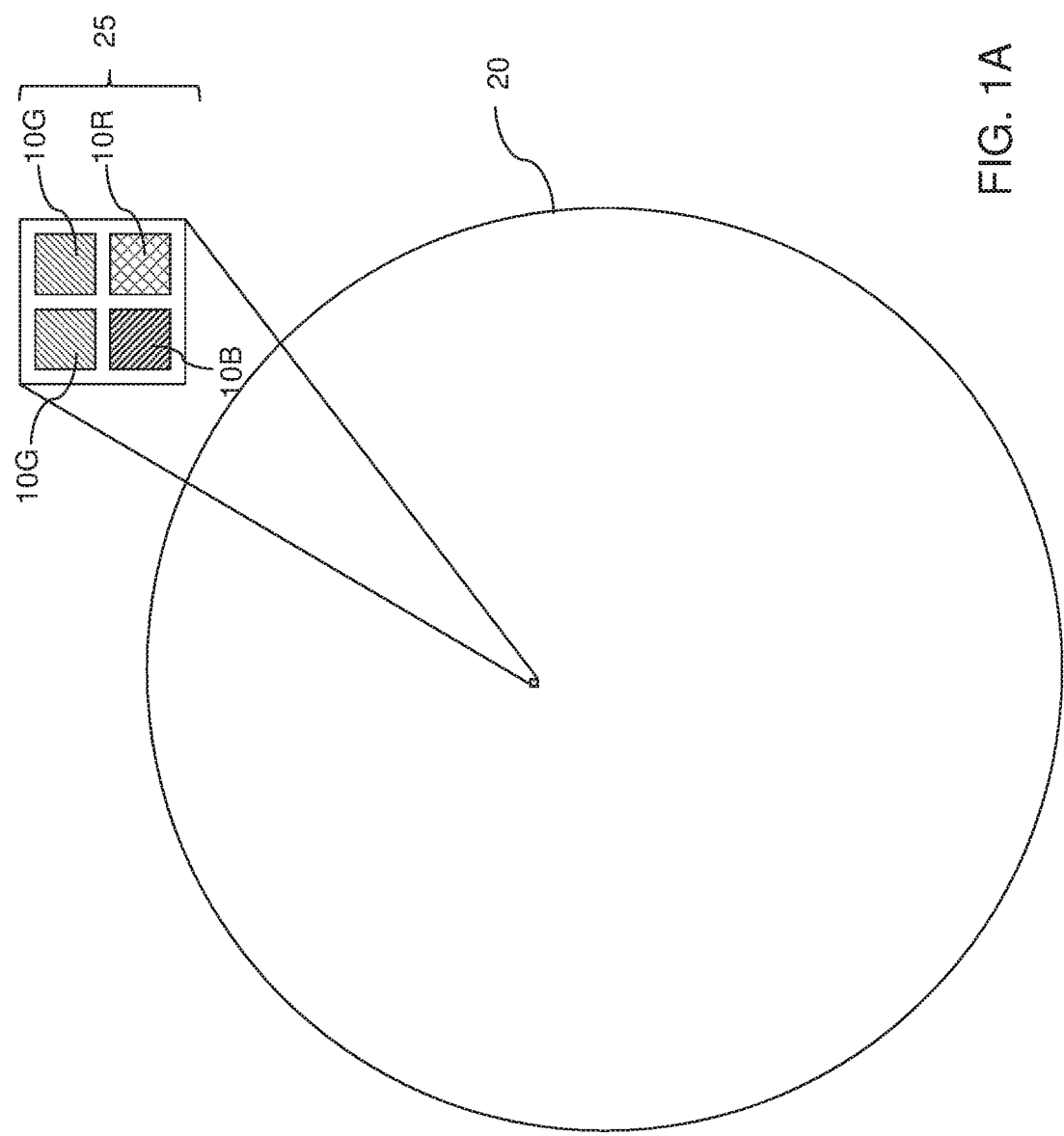

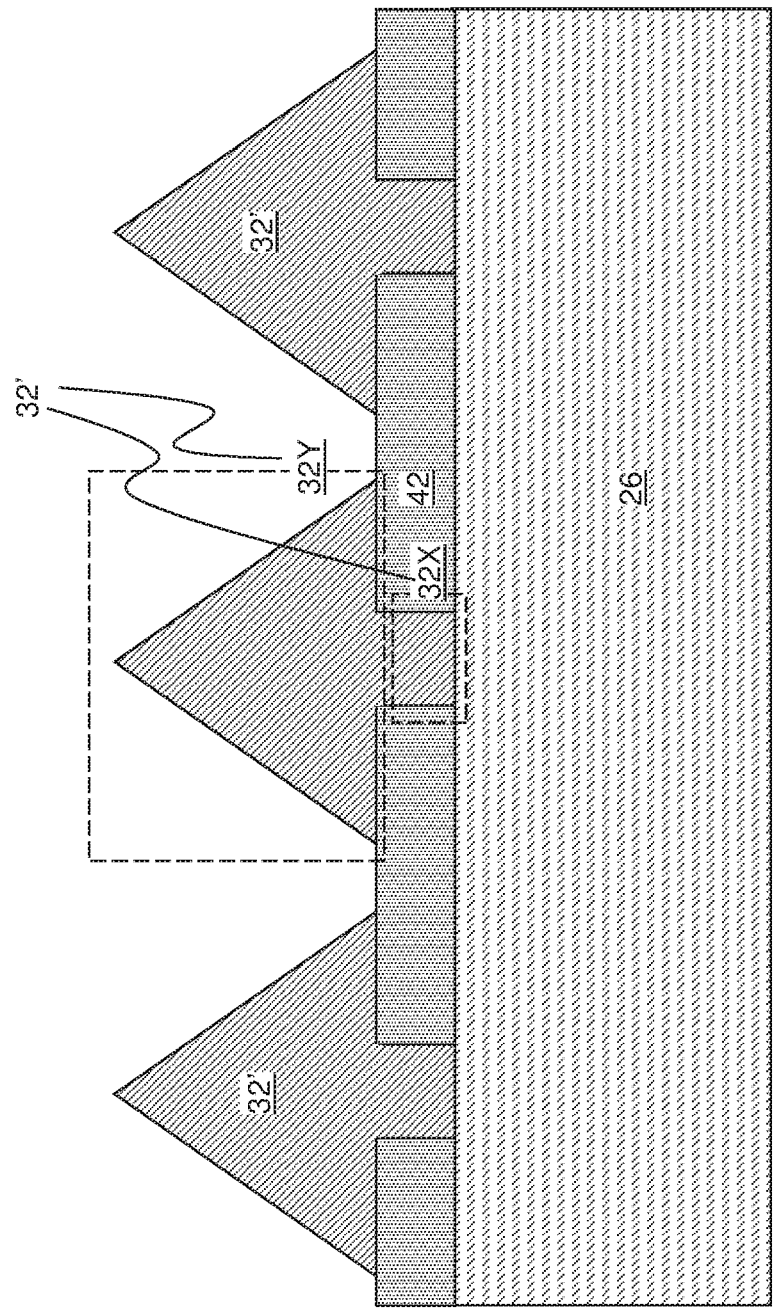

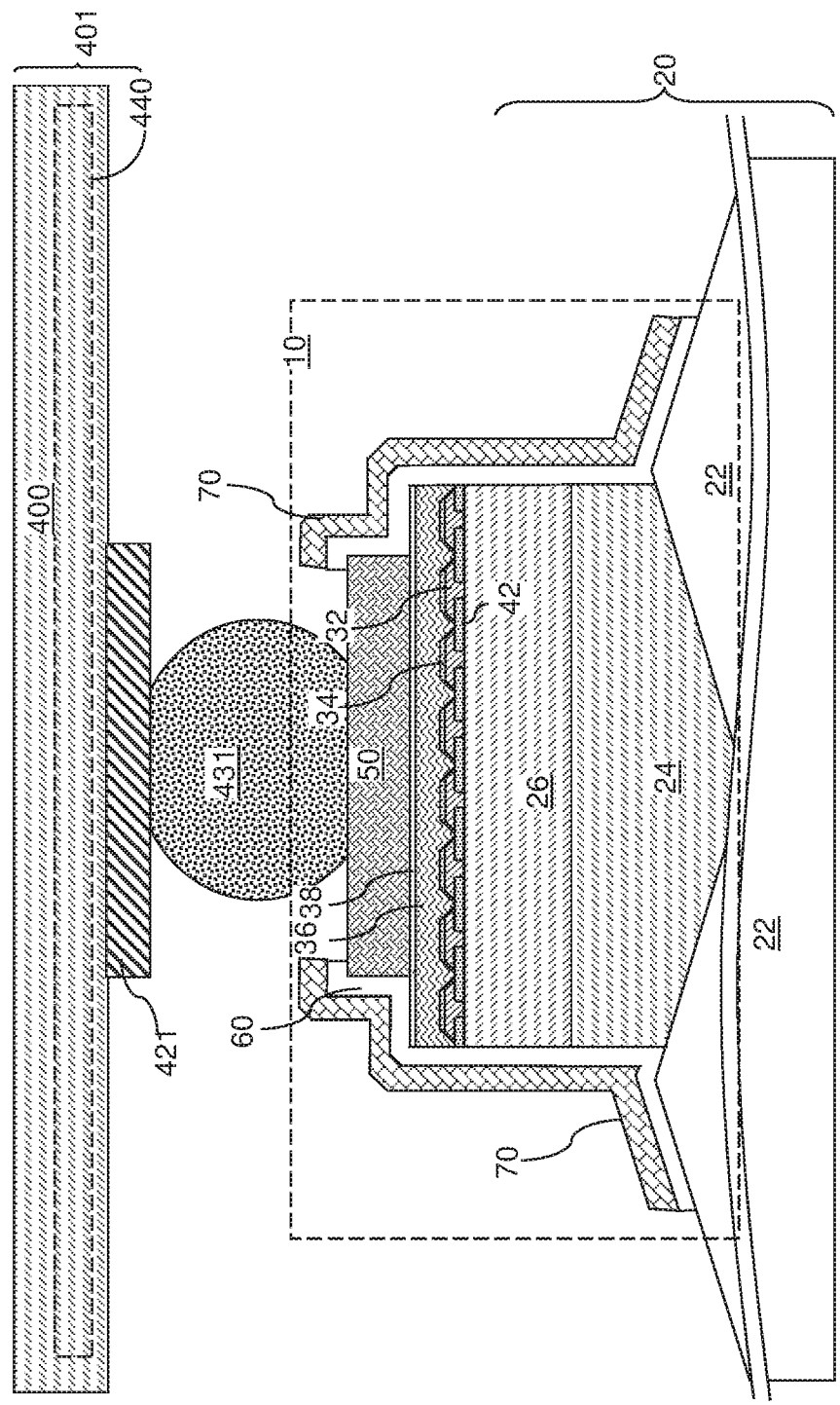

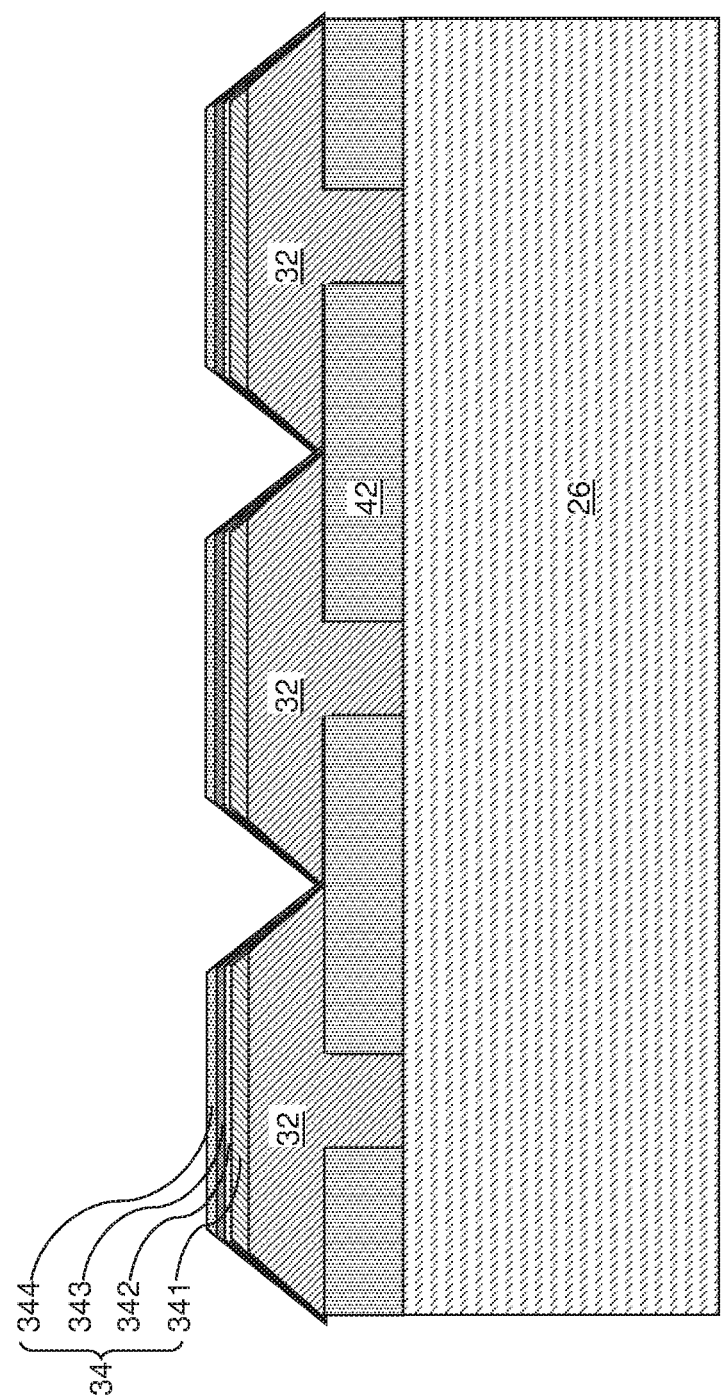

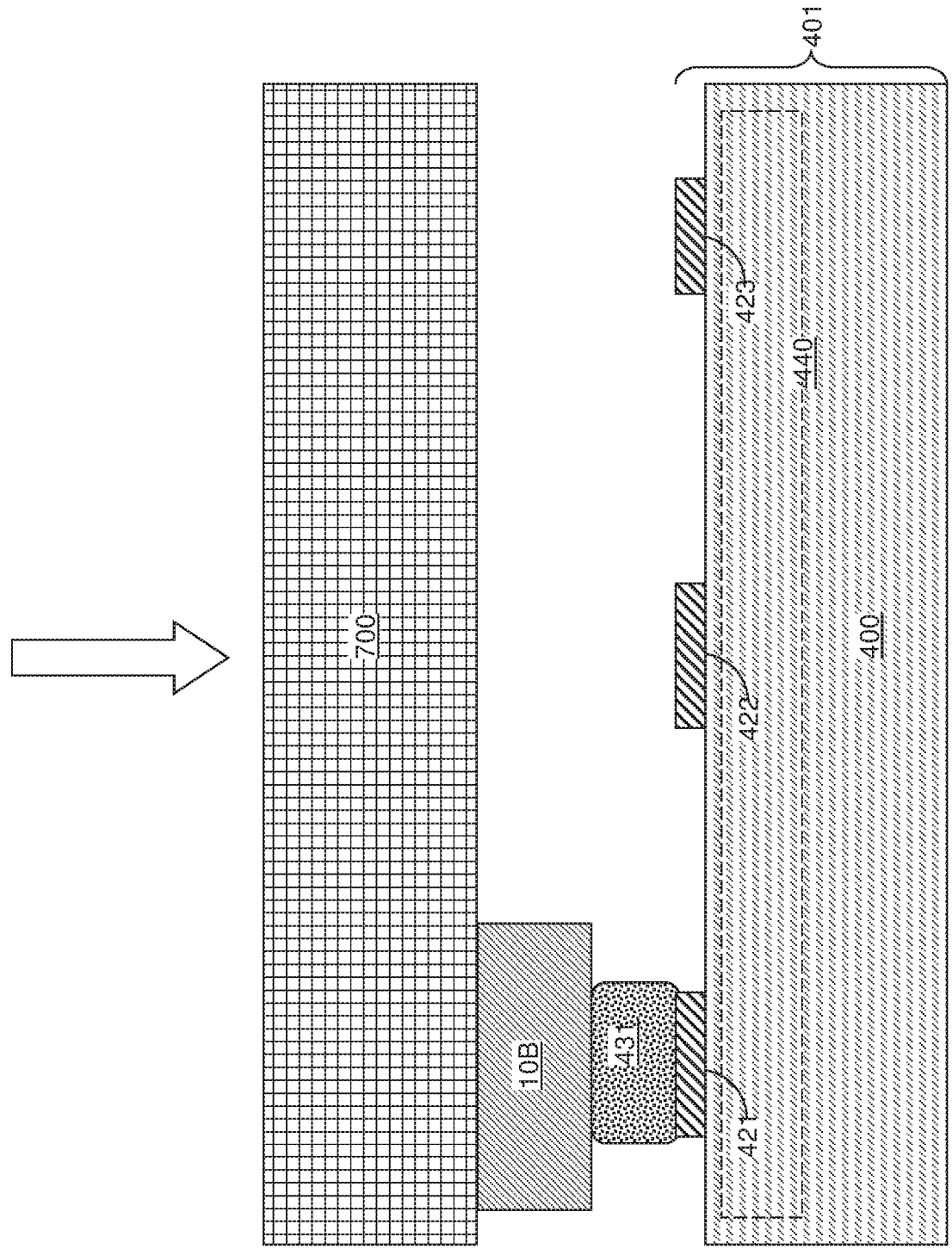

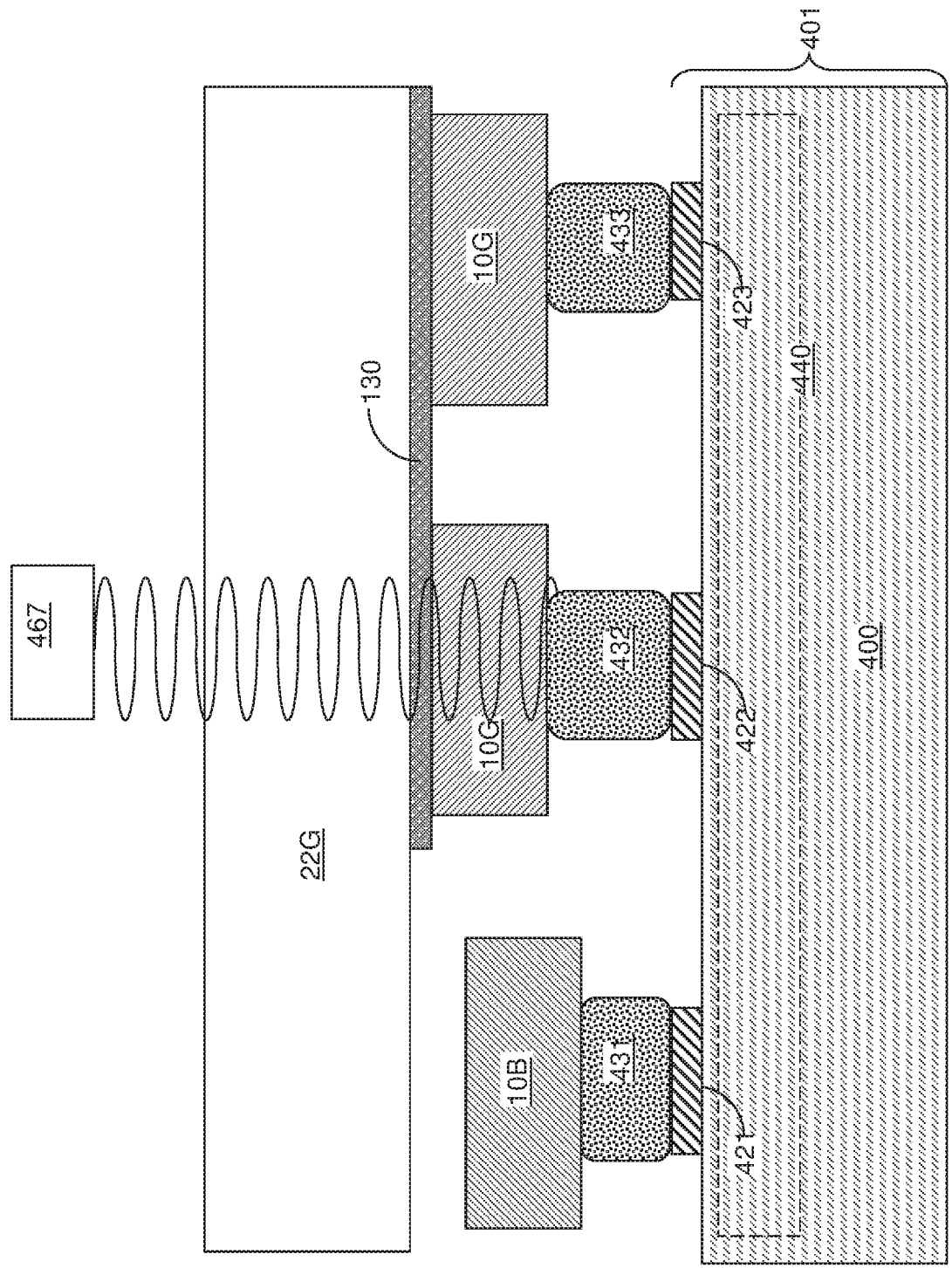

US 11,257,983 B2

LIGHT EMITTING DIODES FORMED ON NANODISK SUBSTRATES AND METHODS OF MAKING THE SAME

RELATED APPLICATIONS

The instant application claims the benefit of priority of U.S. Provisional Application No. 62/656,194 filed on Apr. 11, 2018, the entire contents of which is incorporated herein by reference.

FIELD

The present invention relates to light emitting devices, and particularly to light emitting diode subpixels formed on nanodisk shaped pseudosubstrates and methods of fabricating the same.

BACKGROUND

Light emitting devices such as light emitting diodes (LEDs) are used in electronic displays, such as backlights in liquid crystal displays located in laptops or televisions. Light emitting devices include light emitting diodes (LEDs) and various other types of electronic devices configured to emit light.

SUMMARY

According to an aspect of the present disclosure, a light emitting device (LED) is provided, which comprises: a substrate including a doped compound semiconductor layer; a growth mask layer located on a top surface of the doped compound semiconductor layer and including openings therethrough; a plurality of semiconductor nanostructures located on the growth mask layer and having a doping of a first conductivity type, wherein each of the plurality of semiconductor nanostructures includes a respective nanofrustum including a bottom surface, a top surface, tapered planar sidewalls, and a height that is less than a maximum lateral dimension of the top surface, and a respective pillar portion contacting the bottom surface of the nanofrustum and located within a respective one of the openings through the growth mask layer; a plurality of active regions, wherein each of the plurality of active regions is located on a respective one of the nanofrustums and includes an optically active compound semiconductor layer stack configured to emit light; and a second conductivity type semiconductor material layer having a doping of a second conductivity type and located on each of the plurality of active regions.

According to another aspect of the present disclosure, a method of forming a light emitting device is provided, which comprises: forming a growth mask layer including openings therethrough on a top surface of a doped compound semiconductor layer in a substrate; forming a plurality of semiconductor nanostructures having a doping of a first conductivity type through, and over, the growth mask layer, wherein each of the plurality of semiconductor nanostructures includes a nanofrustum including a bottom surface, a top surface, tapered planar sidewalls, and a height that is less than a maximum lateral dimension of the top surface, and a pillar portion contacting the bottom surface of the nanofrustum and located within a respective one of the openings through the growth mask layer; forming a plurality of active regions on the nanofrustums, wherein each of the plurality of active regions includes a respective optically active compound semiconductor layer stack configured to emit light; and forming a second conductivity type semiconductor material layer having a doping of a second conductivity type on each of the plurality of active regions.

BRIEF DESCRIPTION OF THE DRAWINGS

FIG. 1A is a plan view of a substrate with light emitting diodes of multiple colors according to an embodiment of the present disclosure.

FIG. 3C is a magnified view of region C within FIG. 3B.

FIG. 8 is a vertical cross-sectional view of the first exemplary structure after patterning of various layers within the first exemplary structure, formation of a dielectric material layer and a reflector layer, and attachment to a backplane through a conductive bonding structure according to the first embodiment of the present disclosure.

FIG. 10 is a vertical cross-sectional view of a region of the second exemplary structure after formation of active regions according to the second embodiment of the present disclosure.

DETAILED DESCRIPTION

Figure 1B:
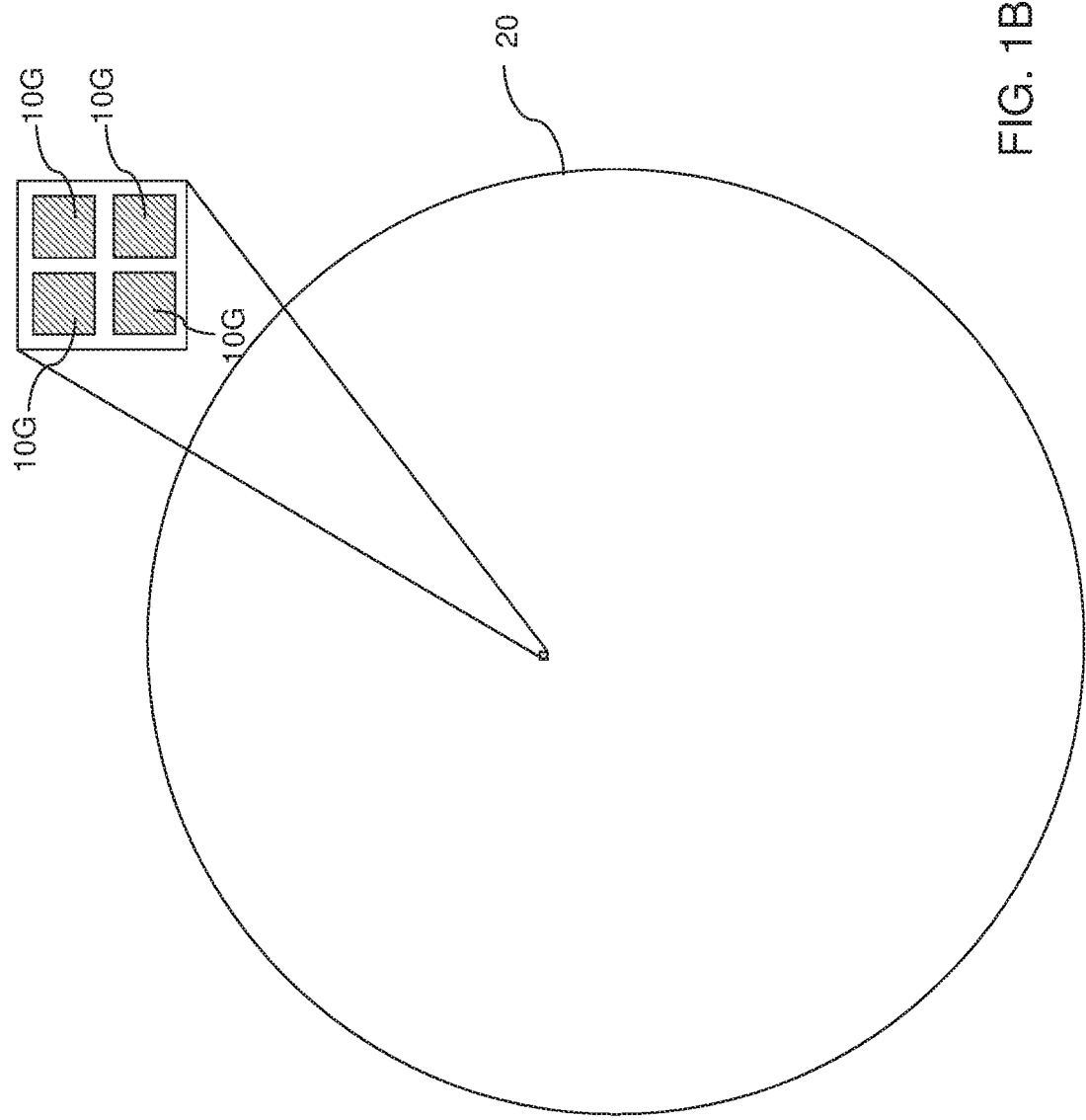
FIG. 1B is a plan view of a substrate with light emitting diodes of a same color according to an embodiment of the present disclosure.

As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rate means layer growth rate along the direction perpendicular to a growth surface when not otherwise specified.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, LEDs employing semiconductor nanostructures 32 and active regions 34 and/or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanostructure LED in each pixel is replaced with a regrown red emitting planar LED, such as an organic or inorganic red emitting planar LED to form a red emitting subpixel.

FIG. 1A illustrates a substrate 20 on which an array of pixels 25 is fabricated. Each pixel 25 can include a plurality of subpixels (10B, 10G, 10R), each of which includes a cluster of light emitting nanostructures configured to emit light at a respective wavelength. Each pixel 25 can include light emitting diodes that emit light at different wavelengths. For example, each pixel 25 can include at least one first-type light emitting diode 10G (such as at least one green-light-emitting diode, for example two green-light-emitting diodes) that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm). The number of each type of light emitting diodes within a pixel 25 can be selected to provide a suitable level of illumination per pixel. For example, plural nanostructure LEDs which emit green, blue and red light are formed in each respective green, blue and red light emitting areas of the pixel 25. Optionally, one of the sites in the pixel 25 (e.g., the site of one of the green-emitting LEDs 10G) may be left vacant as a repair site for later attaching a repair LED device to compensate for a defective or non-functioning LED device 10G, 10B or 10R in a particular pixel 25. A vacant site may be employed for one or more additional functionalities for a display device such as touch recognition through use of an infrared photodiode sensor. Methods of forming light emitting diodes having different peak wavelengths on a single semiconductor substrate, i.e., without stacking multiple substrates over one another, is disclosed, for example, in U.S. Pat. No. 9,054,233 B2 to Ohlsson et al, which is incorporated herein by reference in its entirety.

The pixels 25, or a subset of the subpixels (10B, 10G, 10R) can be subsequently transferred to a backplane to provide a direct view display device, as will be described in more detail below. As used herein, a direct view display device refers to a display device in which each pixel 25 includes at least one light source that generates light from within upon application of a suitable electrical bias. Thus, a direct view display device does not require a back light unit or a liquid crystal material. As used herein, a "multicolor" pixel refers to a pixel that can emit light of different peak wavelengths depending on application of electrical bias, and thus, inherently capable of displaying multiple colors.

Alternatively, only a single type of subpixels configured to emit light at a same peak wavelength may be formed on a substrate 20 instead of multiple types of subpixels (10B, 10G, 10R). FIG. 1B illustrates a substrate 20 on which only a single type of subpixels 10G (e.g., green light emitting LEDs) is formed. In this case, multiple substrates 20 can be employed as sources for multiple types of subpixels. For example, a first substrate can include subpixels 10G of a first type that emit light at a first wavelength, a second substrate can include subpixels 10B of a second type that emit light at a second wavelength (e.g., blue light emitting LEDs), and so on (e.g., third substrate can include subpixels 10R of a third type that emit light at a third wavelength, such as red light emitting LEDs).

Figure 2A:
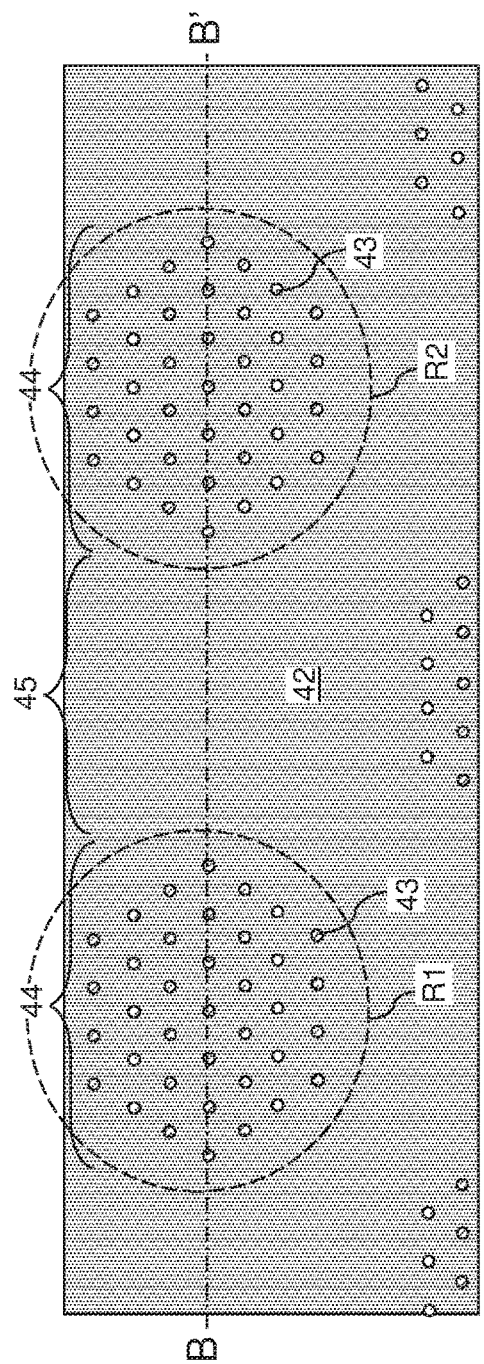
FIG. 2A is a plan view of a first exemplary structure including a substrate and a patterned growth mask layer according to a first embodiment of the present disclosure.
Figure 2B:
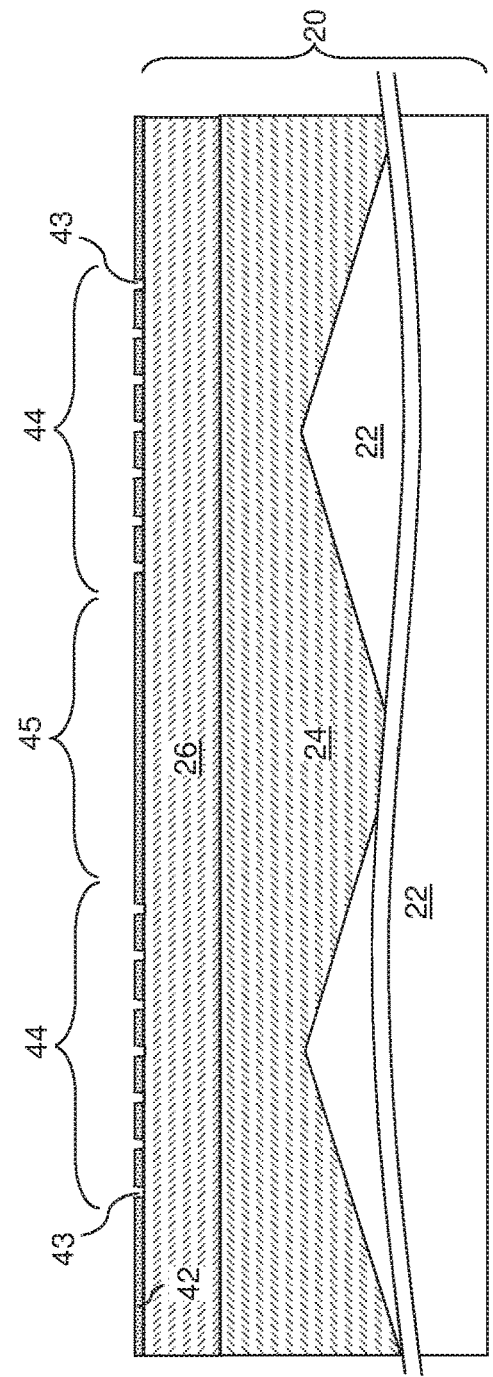
FIG. 2B is a vertical cross-sectional view of the first exemplary structure of FIG. 2A along the vertical plane B-B'.

Referring to FIGS. 2A and 2B, a first exemplary structure is illustrated, which is an in-process structure for fabricating monolithic multicolor pixels 25 or single color subpixels (10B, 10G or 10R) on the substrate 20, such as an initial growth substrate. As used herein, an "in-process" structure refers to a structure that is subsequently modified to make a final structure. The first exemplary structure can include a stack, from bottom to top, of a support substrate 22, an optional buffer layer 24, and a doped compound semiconductor layer 26. The support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the top surface of the single crystalline material layer is possible. The support substrate 22 can include a single crystalline material such as $Al_2O_3$ (sapphire) using either basal plane or r-plane growing surfaces, diamond, Si, Ge, GaN, AlN, SiC in both wurtzite (α) and zincblende (β) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the top surface of the support substrate 22, the lateral dimensions of each bump or each dimple can be in a range from 1.5 microns to 6 microns although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material, for example a Group III-nitride compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the top surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the buffer layer 24 can include $Ga_{1-w-x}In_wAl_xNi_{1-x-z}As_yP_z$ in which y and z between zero and less than one, that matches the lattice constant of the top surface of the support substrate 22. The materials that can be employed for an top portion of the buffer layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb).

The composition of the buffer layer 24 can gradually change between the bottom portion of the buffer layer 24 and the top portion of buffer layer 24 such that dislocations caused by a gradual lattice parameter change along the growth direction (vertical direction) does not propagate to the top surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the top surface of the buffer layer 24. Optionally, the top surface of the buffer layer 24 may be planarized to provide a planar top surface, for example, by chemical mechanical planarization. A suitable surface clean process can be performed after the planarization process to remove contaminants from the top surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the top surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed.

A patterned growth mask layer 42 can be formed on the top surface of the substrate 20 (e.g., on top of the doped compound semiconductor layer 26). The patterned growth mask layer 42 can be formed, for example, by depositing a dielectric material layer and patterning the dielectric material layer to form openings 43 therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of nanostructures to be subsequently formed. The pattern of the openings in the photoresist layer can be transferred through the dielectric material layer to form the patterned growth mask layer 42. The photoresist layer can be subsequently removed, for example, by ashing. Alternatively, the growth mask layer can be patterned using electron beam lithography or nano-imprint lithography followed by etching.

The patterned growth mask layer 42 includes openings 43, which may, or may not, be arranged as a two-dimensional periodic array. The shape of each opening 43 may be circular, elliptical, or polygonal (such as hexagonal). A portion of the top surface of the doped compound semiconductor layer 26 is physically exposed underneath each opening 43 through the patterned growth mask layer 42.

As shown in FIGS. 2A and 2B, the openings 43 through the patterned growth mask layer 42 can form a pattern of clusters 44 that are laterally spaced from one another. Each cluster 44 of openings 43 can be located within a respective nanostructure region (R1, R2) that is laterally spaced apart from one another by an inter-cluster region 45 that lacks openings 43 and having a spacing that is greater than the average nearest neighbor distance among openings within each of the nanostructure cluster 44 regions (R1, R2). The spacing that can be greater than the average nearest neighbor distance among openings within each of the nanostructure cluster 44 regions by at least 10%, such as by at least 50%, such as by at least two times. In one embodiment, the openings 43 within each cluster 44 can be arranged as a periodic two-dimensional array. In one embodiment, each cluster 44 of openings 43 can be a periodic two-dimensional array of openings 43 having a same periodicity. For example, each cluster 44 of openings 43 can be a hexagonal array of openings 43 in which the openings have a same shape and size (such as a circular shape of a same size). The periodicity may be the same within each hexagonal array of openings 43. Alternatively, a rectangular array may be employed for each cluster of openings 43. Each cluster 44 can be bounded by imaginary straight or curved lines which follow the outermost openings 43 in each cluster 44. For example, each cluster 44 having a hexagonal array of openings 43 may have six straight lines as an outer boundary, and each cluster 44 having a rectangular array of openings 43 may have four straight lines as an outer boundary.

The maximum dimension of each opening 43 (which may be a diameter, a major axis, or a diagonal dimension) may be in a range from 5 nm to 500 nm (such as from 10 nm to 200 nm, e.g., 50 nm to 100 nm), although lesser and greater dimensions may also be employed. The nearest neighbor distance within the periodic array of openings 43 can be in a range from 20 nm to 5 microns, such as from 50 nm to 500 nm, although lesser and greater nearest neighbor distances can also be employed. The total number of openings 43 within each cluster 44 of openings 43 (which may be each array of openings 43) can be in a range from 1 to 1000, such as from 10 to 30, although lesser and greater number of openings can also be employed. The length of each cluster 44 (i.e., the length of each outer boundary segment of the cluster) can be 0.5 to 10 microns, microns, such as 1 to 5 microns, for example 2 to 4 microns for a micro-LED type direct view display. The minimum distance (i.e., the length of the inter-cluster region 45) between the outer boundaries of each neighboring pair of clusters 44 of openings 43 can be in a range from 2 to 20 times (such as 3 to 10 times) a pitch of the openings 43 (i.e., distance between nearest neighbor openings) in either of the neighboring pair of clusters 44 of openings 43, although lesser and greater distances can also be employed. The outer boundaries of each cluster 44 can correspond to the outer boundaries of a subpixel 10G, 10B, 10R of a direct view display device or to regions, such as pixels or subpixels of a monochrome light emitting device. Generally, the spacing between neighboring clusters 44 of openings 43 can be selected such that multiple portions of a second conductivity type semiconductor material layer to be subsequently formed do not merge between any neighboring pair of clusters after formation. In one embodiment, the fill factor of openings 43 in each cluster 44 is at least 10%, such as 10% to 20%, including 12% to 15%, where a fill factor is a ratio of the total area of the openings 43 to the total area of the growth mask layer 42 in each cluster (i.e., at least 10% of the surface area of each cluster comprises the openings 43).

While only a region of the first exemplary structure is illustrated herein, it is understood that the first exemplary structure can laterally extend along two independent horizontal directions as a two-dimensional array. The exemplary pattern illustrated in FIGS. 2A and 2B may be repeated across a region of the substrate 20, or across the entirety of the substrate 20. Thus, multiple instances of the illustrated structures in the drawings can be formed in the first exemplary structure.

Figure 3A:
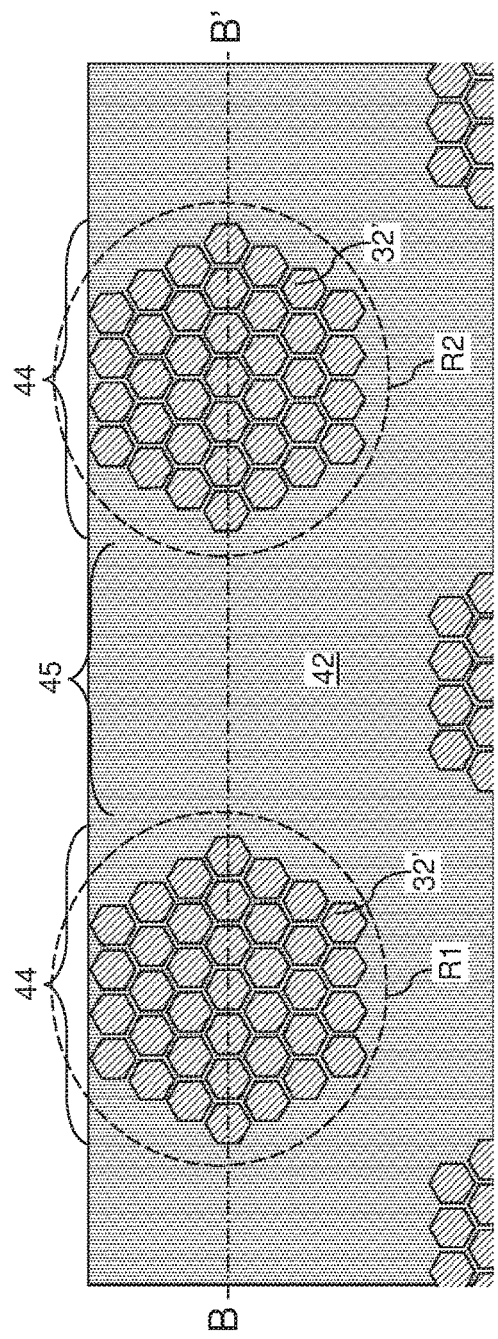
FIG. 3A is a plan view of the first exemplary structure after formation of arrays of nanopyramids according to the first embodiment of the present disclosure.
Figure 3B:
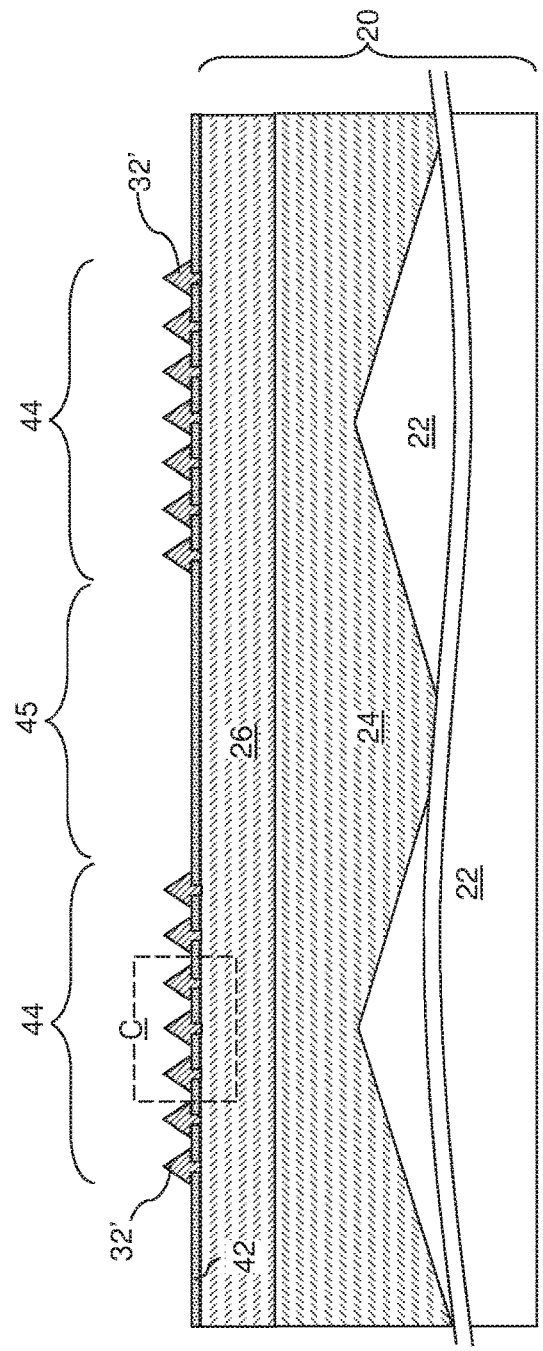
FIG. 3B is a vertical cross-sectional view of the first exemplary structure of FIG. 3A along the vertical plane B-B'.

Referring to FIGS. 3A-3C, a plurality of in-process semiconductor nanostructures 32' are grown through, and over, the growth mask layer 42 by a selective compound semiconductor deposition process. As used herein, an "in-process" structure refers to a structure that is formed during manufacture of a device and is subsequently modified so that the structure has a different form in a final device. Each of the plurality of in-process semiconductor nanostructures 32' includes a respective nanopyramid 32Y including a bottom surface, an apex, and tapered planar sidewalls adjoining the apex, and a respective pillar portion 32X contacting the bottom surface of the respective nanopyramid 32Y. Each respective pillar portion 32X is located in a respective opening 43 while each respective nanopyramid 32Y is located on the top surface of the growth mask layer 42.

As used herein, a "nanopyramid" refers to an object including a polygonal base, a set of tapered sidewalls each having a bottom edged adjoined to a respective side of the polygonal base, an apex at which each of the tapered sidewalls meet, and a height that is less than 10,000 nm. As used herein, a "tapered" element refers to an element that is not horizontal and is not vertical. Each nanopyramid 32Y includes a doped compound semiconductor material having a doping of the first conductivity type (e.g., n-type), i.e., the conductivity type of doping of the doped compound semiconductor layer 26. The material of the nanopyramids 32Y may be the same as, or may be different from, the material of the doped compound semiconductor layer 26. In one embodiment, the first conductivity type can be n-type, and each nanopyramid 32Y includes an n-doped compound semiconductor material such as III-nitride compound semiconductor material, for example n-doped gallium nitride or indium gallium nitride. Alternatively, any other suitable III-V or II-VI material may be used.

Each of the nanopyramids 32Y can be formed with a set of angled facets, i.e., facets that are not horizontal and not vertical (i.e., not parallel or perpendicular to the top surface of the substrate 20) that define a set of tapered sidewalls. The nanopyramids 32Y can be grown, for example, by selective epitaxial growth of an n-doped compound semiconductor material. The process parameters of the selective epitaxial growth process can be selected such that an n-doped compound semiconductor material grows upward with angled facets having a respective p-pane outer surface from each opening 43 through the patterned growth mask layer 42. Methods for growing the nanopyramids 32Y through the openings 43 in the patterned growth mask layer 42 with faceted sidewalls are described, for example, in U.S. Pat. No. 9,444,007 to Krylouk et al., U.S. Pat. No. 9,419,183 to Lowgren et al., U.S. Pat. No. 9,281,442 to Romano et al., and U.S. Pat. No. 8,669,574 to Konsek et al., each of which is assigned to Glo AB and is incorporated herein by reference in their entirety. In one embodiment, the height of the nanopyramids 32Y can be in a range from 10 nm to 200 nm, such as from 25 nm to 100 nm, although lesser and greater heights can also be employed. In the above described embodiment, the nanopillar 32X growth step occurs through an opening 43 in a mask 42 followed by the nanopyramid 32Y epitaxial growth on the nanopillar 32X. However, any other suitable nanostructure growth regime can be utilized, such as VLS growth using a catalyst particle or other selective growth methods. Thus, the selective nanostructure growth is therefore used to merely exemplify rather than limit the invention.

Figure 3D:
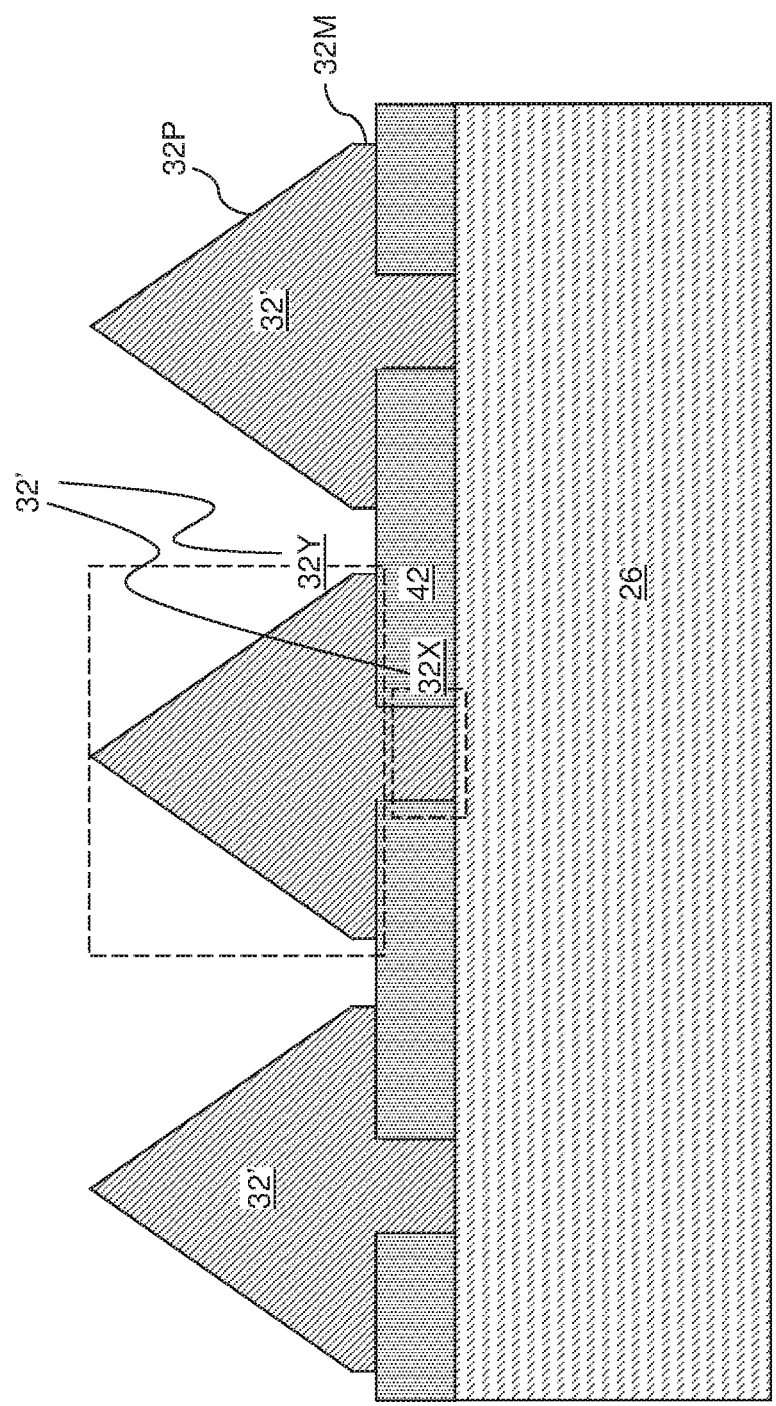
FIG. 3D is vertical cross-sectional view of an alternative configuration of the first exemplary structure.

In one embodiment, each of the nanopyramids 32Y can include the base plane that contacts the top surface of the growth mask layer 42, and a set of tapered sidewalls that adjoin the edges of the base plane and are adjoined at an apex. The width of the base plane of the nanopyramid can be from 100 nm to 1,000 nm, such as from 200 nm to 500 nm. In one embodiment, the base plane can be a crystallographic c-plane, and the set of tapered sidewalls can be a set of p-planes, as shown in FIG. 3C. In an alternative embodiment shown in FIG. 3D, the sidewalls can include lower portions 32M which are set of vertical m-planes which contact the growth mask layer 42, and upper portions 32P which are a set of p-planes which contact the respective lower portions 32M and which meet each other at the apex. In one embodiment, each nanopyramid 32Y can be a polygonal nanopyramid having a polygon as the shape of the base plane. In one embodiment, each nanopyramid can be a rectangular nanopyramid in which the shape of the base plane is a hexagon. The hexagonal shape of the base plane can be induced by crystallographic growth of the p-planes (or growth of m-planes 32M followed by p-planes 32P as shown in FIG. 3D) as the tapered sidewall surfaces of the nanopyramids. Because formation of the faced p-planes is induced by inherent crystallographic symmetry, it is not necessary to form the openings 43 in the growth mask layer 42 with hexagonal cross sectional shape. In one embodiment, the openings 42 in the growth mask layer 42 can have circular shapes or elliptical shapes, and the base plane of each nanopyramid 32Y can have a respective hexagonal shape. In one embodiment, the hexagonal shape can be a regular hexagonal shape due the six-fold symmetry of the crystalline semiconductor material portions that grow into the nanopyramids 32Y.

Figure 4A:
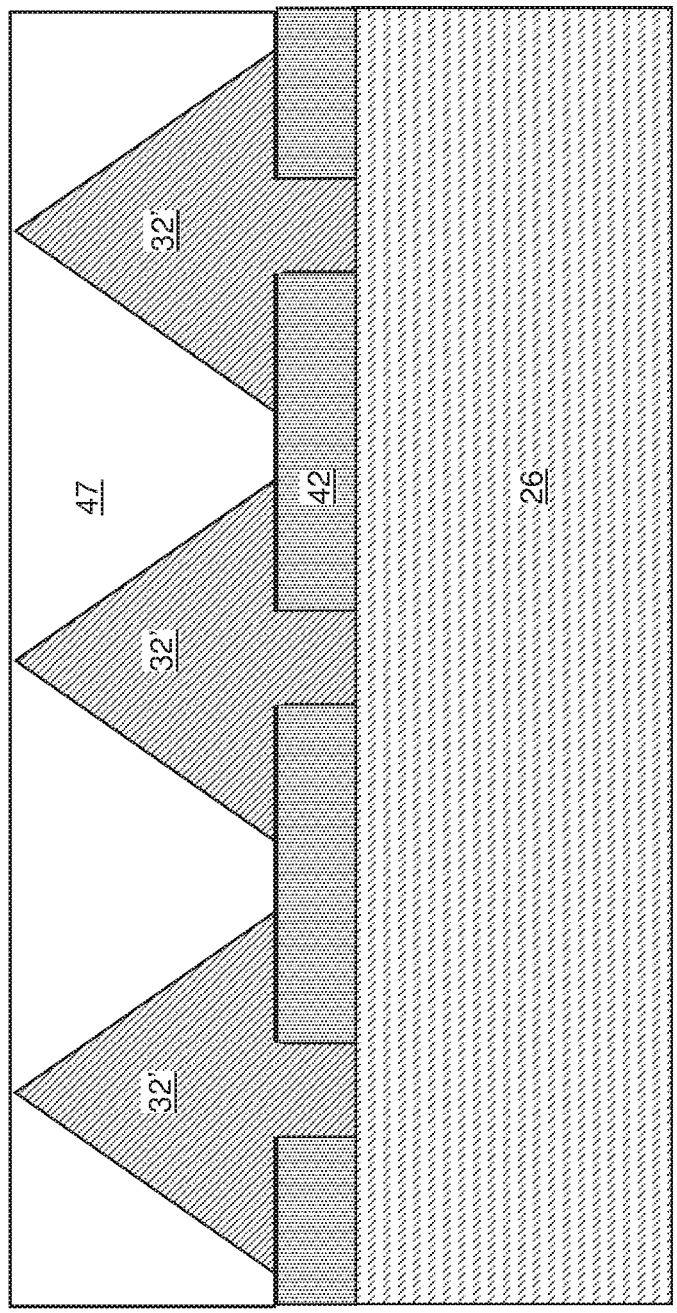
FIGS. 4A and 4B are vertical cross-sectional views of region C of the first exemplary structure before and after an anisotropic etch process, respectively, according to the first embodiment of the present disclosure.
Figure 4B:
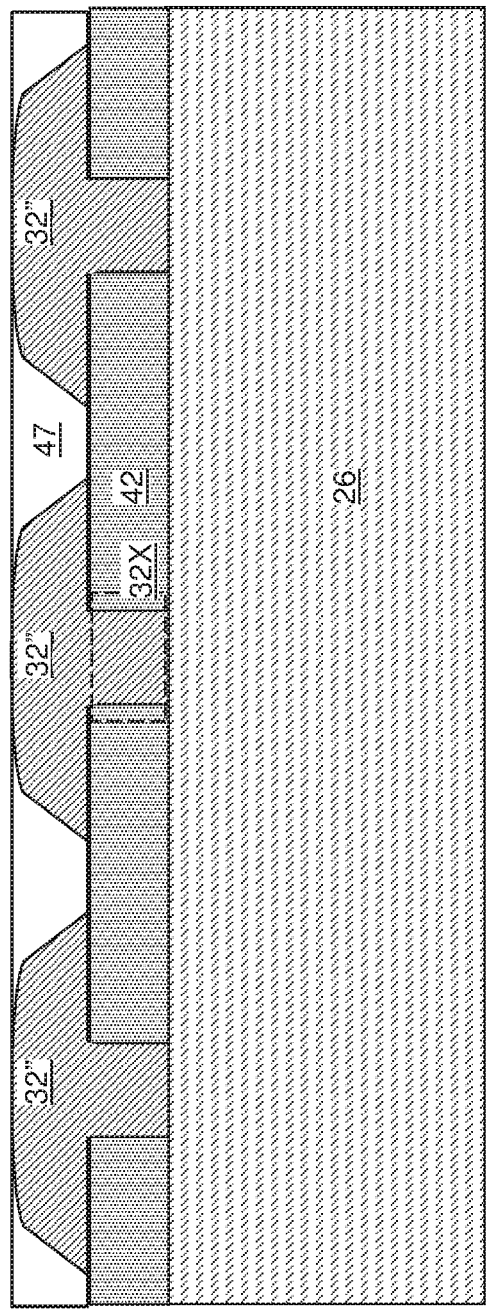

Referring to FIGS. 4A and 4B, an anisotropic etch process is performed to etch top portions of the nanopyramids 32Y without etching the bottom portions of the nanopyramids 32Y. For example, a sacrificial layer 47, such as a photoresist layer or another suitable layer, is formed over and between the nanopyramids 32Y, as shown in FIG. 4A. The sacrificial layer 47 and the nanopyramids 32Y are then anisotropically etched at about the same etch rate until the nanopyramids 32Y are partially etched, as shown in FIG. 4B. In one embodiment, the anisotropic etch process can include an inductively coupled plasma etch process. An inductively coupled plasma (ICP), or transformer coupled plasma (TCP), is a type of plasma in which the energy is supplied by inductive electrical currents, i.e., electrical currents induced by a change in magnetic flux. Such an inductively coupled plasma etch process can etch protruding portions (such as the top portions of the nanopyramids 32Y) at about the same rate as the sacrificial layer 47. The remaining portions of the sacrificial layer 47 shown in FIG. 4B can be removed selective to the nanopyramids 32Y after the etching step by any selective removal method, such as by ashing if the sacrificial layer 47 is a photoresist layer. Modified in-process semiconductor structures 32" are formed by the remaining portions of the in-process semiconductor structures 32'. Each modified in-process semiconductor structure 32" includes a pillar portion 32X and a remaining portion of a nanopyramid 32Y, which can have a general shape of a frustum with a planar or a non-planar top surface (such as a convex top surface) and a set of tapered sidewalls that may be planar or non-planar depending on the process conditions of the anisotropic etch process. The modified in-process semiconductor structures 32" may have a hexagonal nanodisk shape when viewed from the top. In one embodiment, the tapered sidewalls can be generally along the p-plane facets with convexity. While only the p-plane sidewalls 32P are shown in FIG. 4B, it should be understood that the modified in-process semiconductor structures 32" can have both the m-plane sidewalls 32M and the p-plane sidewalls 32P of the alternative configuration shown in FIG. 3D. A plurality of semiconductor nanostructures is subsequently derived from the modified in-process semiconductor structures 32" (which function as pseudosubstrates for the subsequently formed LEDs). The modified in-process semiconductor structures 32" are remaining portions of the nanopyramids 32Y and the pillar portions 32X and have a fill factor in each cluster 44 of at least 40%, such as 50% to 75%, for example 55% to 60%.

Figure 5A:
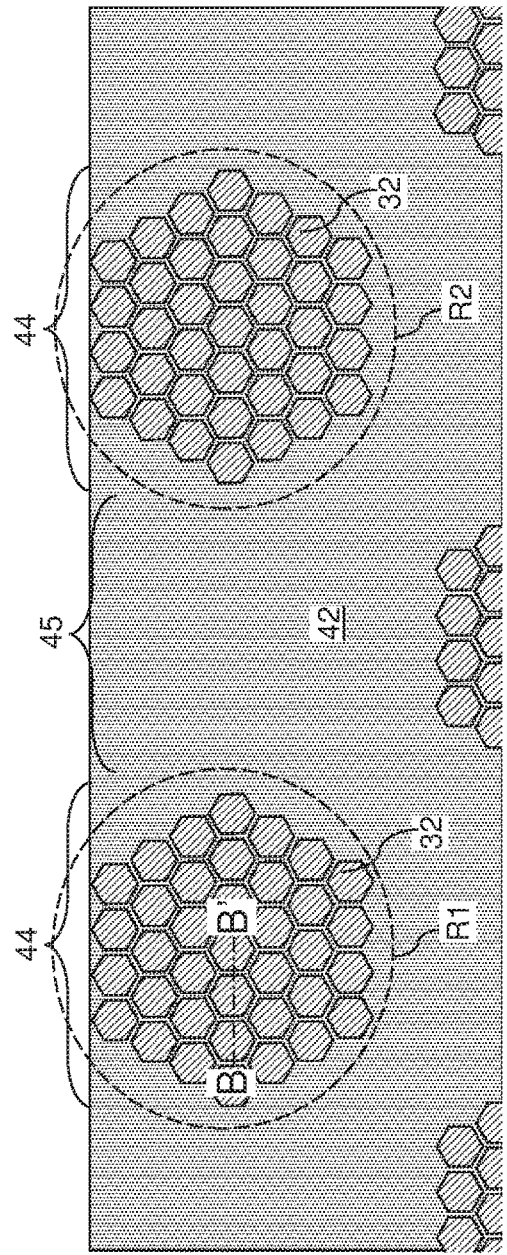
FIG. 5A is a plan view of the first exemplary structure after an anneal process that forms arrays of semiconductor nanostructures including nanofrustums and pillar portions according to the first embodiment of the present disclosure.
Figure 5B:
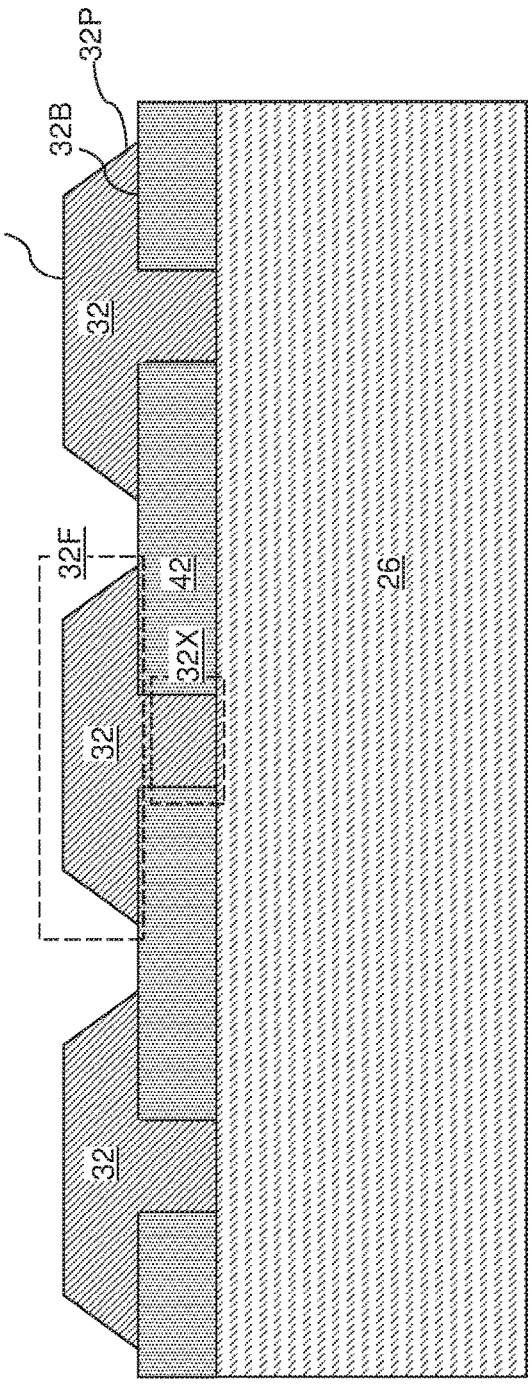
FIG. 5B is a vertical cross-sectional view of the first exemplary structure of FIG. 5A along the vertical plane B-B'.
Figure 5C:
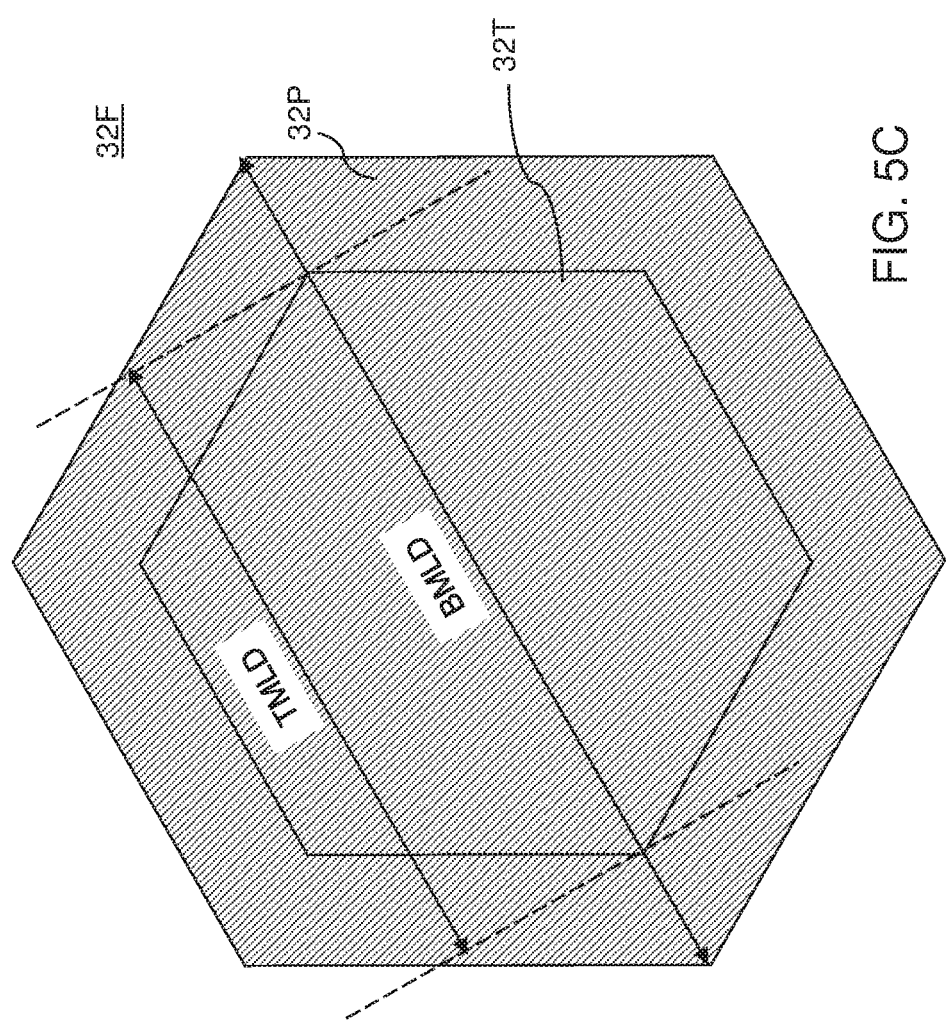
FIG. 5C is a top-down view of a nanofrustum in the first exemplary structure of FIGS. 5A and 5B.

Referring to FIGS. 5A-5C, an optional anneal process is performed to induce rearrangement of the material of the modified in-process semiconductor structures 32". In this case, the remaining portions of the nanopyramids 32Y are converted into nanofrustums 32F. As used herein, a "nanofrustum" refers to an object having the shape of a frustum and having a height that does not exceed 5,000 nm. Each nanofrustum 32F can have a bottom surface, a top surface, tapered planar sidewalls, and a height that is less than a maximum lateral dimension TMLD of the top surface. The base plane (i.e., bottom surface 32B) of each nanofrustum 32F can have a maximum lateral dimension (e.g., width) of 100 nm to 1,000 nm, such as 200 nm to 500 nm. Each nanofrustum 32F can have a height (which extends from the bottom surface 32B to the top surface 32T) of 10 nm to 200 nm, such as 25 nm to 100 nm, for example 50 nm to 75 nm.

In one embodiment shown in FIG. 5C, the ratio of a maximum lateral dimension TMLD of the top surface 32T to the maximum lateral dimension BMLD of the bottom surface 32B is in a range from 0.3 to 0.9, such as from 0.5 to 0.8, for each of the nanofrustums 32F. In one embodiment, the ratio of the height to the maximum lateral dimension TMLD of the top surface is in a range from 0.05 to 0.5, such as 0.1 to 0.4 for each of the nanofrustums 32F. In one embodiment, the ratio of the maximum dimension of the pillar portion 32X to the height of the nanofrustum 32F is in a range from 0.02 to 0.5, such as from 0.05 to 0.2, for each of the plurality of semiconductor nanostructures 32.

The anneal process induces arrangement of the material of the remaining portions of the nanopyramids 32Y at least through surface diffusion, and optionally through bulk diffusion, to reconstruct the faceted surfaces. Specifically, the top surface 32T of each remaining portion of the nanopyramids 32Y can be reconstructed into a respective c-plane crystallographic facet, and the tapered sidewalls 32P of each remaining portion of the nanopyramids 32Y can be reconstructed into a respective set of p-plane crystallographic facets. Bottom edges of the p-plane crystallographic facets of the tapered sidewalls 32P can contact the top surface of the growth mask layer 42. Alternatively, the bottom edges of the p-plane crystallographic facets of the tapered sidewalls 32P can contact the m-plane facets 32M which in turn contact the growth mask layer 42. Top edges of the p-plane crystallographic facets of each nanofrustum 32F can contact sides of a c-plane crystallographic facet of the nanofrustum 32F. Side edges of the p-plane crystallographic facets of each nanofrustum 32F can be adjoined among one another.

In an illustrative example, the ambient of the anneal process can include ammonia, and can optionally include an inert gas such as nitrogen. The elevated temperature of the anneal process can be in a range from 900 degrees Celsius to 1,200 degrees Celsius, such as from 1,000 degrees Celsius to 1,150 degrees Celsius. The duration of the elevated temperature under the ambient can be in a range from 1 minute to 2 hours, such as from 2 minutes to 1 hours, although shorter and longer durations can also be employed.

A plurality of semiconductor nanostructures 32 including nanofrustums 32F and pillar portions 32X is formed. In one embodiment, the plurality of semiconductor nanostructures 32 can include arrays of semiconductor nanostructures 32 that are formed in clusters. The plurality of semiconductor nanostructures 32 can have a doping of the first conductivity type, and is formed through, and over, the growth mask layer 43. Each of the plurality of semiconductor nanostructures 32 can include a nanofrustum 32F, and a pillar portion 32X contacting the bottom surface of the nanofrustum 32F and located within a respective one of the openings 43 through the growth mask layer 42. In one embodiment, each of the tapered planar sidewalls includes a respective crystallographic p-plane. In one embodiment, each of the nanofrustums 32F is a hexagonal nanofrustum, i.e., a nanofrustum having a hexagonal base shape. In one embodiment, the nanofrustums 32F are arranged as a two-dimensional array and are not in direct contact among one another. In one embodiment, the fill factor of the nanofrustums 32F in each cluster 44 is greater than 40%, such as 50% to 75%, such as 55% to 60%.

Figure 6:
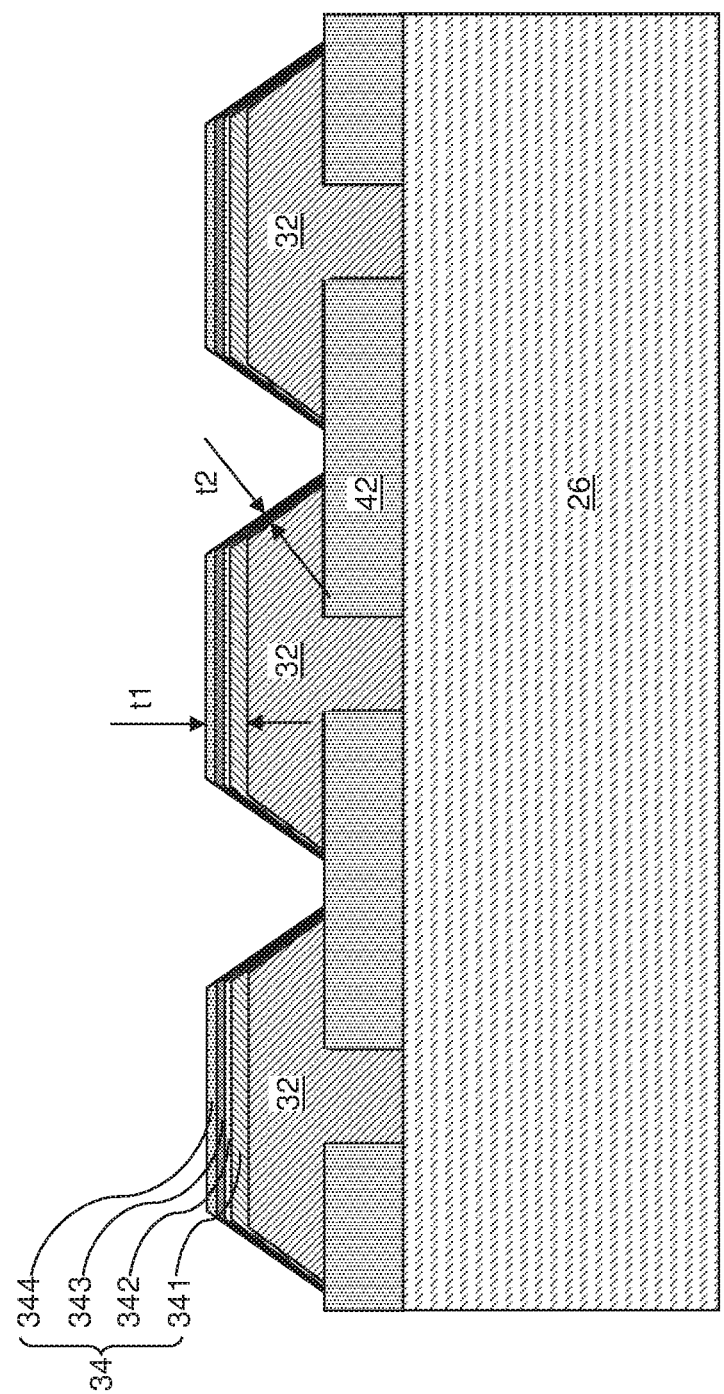
FIG. 6 is a vertical cross-sectional view of a region of the first exemplary structure after formation of active regions according to the first embodiment of the present disclosure.

Referring to FIG. 6, an active region 34 is formed on each nanofrustum 32F. The active region 34 includes at least one semiconductor material that emits light upon application of a suitable electrical bias. For example, each active region 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active region 34 can include any other suitable semiconductor layers or stack of layers for light emitting diode applications provided that it can be grown on the surfaces of the nanofrustums 32F. The set of all layers within an active region 34 is herein referred to as an active layer.

In one embodiment, each of the plurality of active regions 34 includes a respective optically active compound semiconductor layer stack configured to emit light. In a non-limiting illustrative example, the active region 34 can include a silicon-doped GaN layer 341 having a thickness of 30 nm to 70 nm, such as about 50 nm to about 60 nm, a GaN layer 342 having a thickness of 2 nm to 10 nm, such as about 5 nm to 7 nm, an InGaN layer 343 having a thickness of 1 nm to 5 nm, such as about 3 nm to 4 nm, and a GaN barrier layer 344 having a thickness of 10 nm to 30 nm, such as about 15 nm to 20 nm. The sequence of layers, composition of each layer, and the thickness of each layer within the active region 34 can be optimized to increase emission intensity and to provide the target peak emission wavelength. The active region 34 may emit any color light, such as blue, green or red light depending on the composition of the semiconductor material therein and the strain that is applied to the semiconductor material.

A selective epitaxy process can be employed to grow the active regions 34. The process parameters of the selective epitaxy process can be selected such that the active regions 34 are grown as conformal structures having a same thickness throughout. In another embodiment, the active regions 34 can be grown as a pseudo-conformal structure in which the horizontal portions have the same thickness (such as a first thickness t1) throughout, and faceted portions have a thickness (such as a second thickness t2) that is less than the thickness of the horizontal portions. In one embodiment, each of the plurality of active regions 34 can include a top planar portion having the first thickness t1 and sidewall portions overlying tapered planar sidewalls of a respective one of the nanofrustums 32F and having the second thickness t2. In one embodiment, the ratio of the first thickness t1 to the second thickness t2 can be in a range from 2 to 50, although lesser and greater ratios can also be employed. The height of the nanofrustums 32F covered with the active layer 34 can be 75 nm to 750 nm, such as 100 nm to 500 nm. The width of the top surface of the nanofrustums 32F covered with the active layer 34 can be 200 nm to 500 nm and the width of the bottom surface of the nanofrustums 32F covered with the active layer 34 can be 500 nm to 1000 nm. If the m-plane facets 32M are present in the nanofrustums 32F as shown in FIG. 3D, then the active layer 34 may overgrow these m-plane facets 32M and thus exclude any m-plane facets and have only p-plane facet sidewalls.

Methods for growing a layer stack for active regions on nanowires are described, for example, in U.S. Pat. No. 9,444,007 to Kryliouk et al., U.S. Pat. No. 9,419,183 to Lowgren et al., U.S. Pat. No. 9,281,442 to Romano et al., and U.S. Pat. No. 8,669,574 to Konsek et al. The methods for growing active regions on nanowires can be employed to form the active regions 34 of the present disclosure, which are formed on nanofrustums 32F instead of nanowires. In one embodiment, the outer surfaces of the active regions 34 can include horizontal surfaces that extend parallel to the top surface of the doped compound semiconductor layer 26, and tapered faceted surfaces (i.e., tapered sidewalls) located over tapered facets of the nanofrustums 32F. In one embodiment, the horizontal surfaces of the active regions 34 can include crystallographic c-planes, and the tapered faceted surfaces of the active regions 34 can include crystallographic p-planes.

The thickness of the horizontal portions of the active regions 34 (as measured horizontally along a radial direction) can be in a range from 50 nm to 1 micron, although lesser and greater thicknesses can also be employed. Each active region 34 includes an active light emitting layer. The composition of the active regions 34 can be selected to emit light at a desired peak wavelength by changing the composition and strain of the active regions 34. In one embodiment, the active regions 34 can have the same composition and emit light of the same peak wavelength in each cluster 44 (e.g., having the structure shown in FIG. 1B). Alternatively, different clusters 44 can have active regions 34 with different compositions such that the active regions 34 in different clusters 44 emit light with a different peak wavelength (e.g., having the structure shown in FIG. 1A). The active regions 34 can have different compositions by varying the indium concentration of the indium gallium nitride layers 343 of the active regions 34.

An active region 34 contacts, surrounds, and overlies an underlying nanofrustum 32F. In one embodiment, the nanofrustums 32 can be formed as a two-dimensional array having periodicity along two independent directions in each cluster 44. In one embodiment, each cluster 44 corresponds to a subpixel (10G, 10B or 10R) of a direct view display device.

Figure 7:
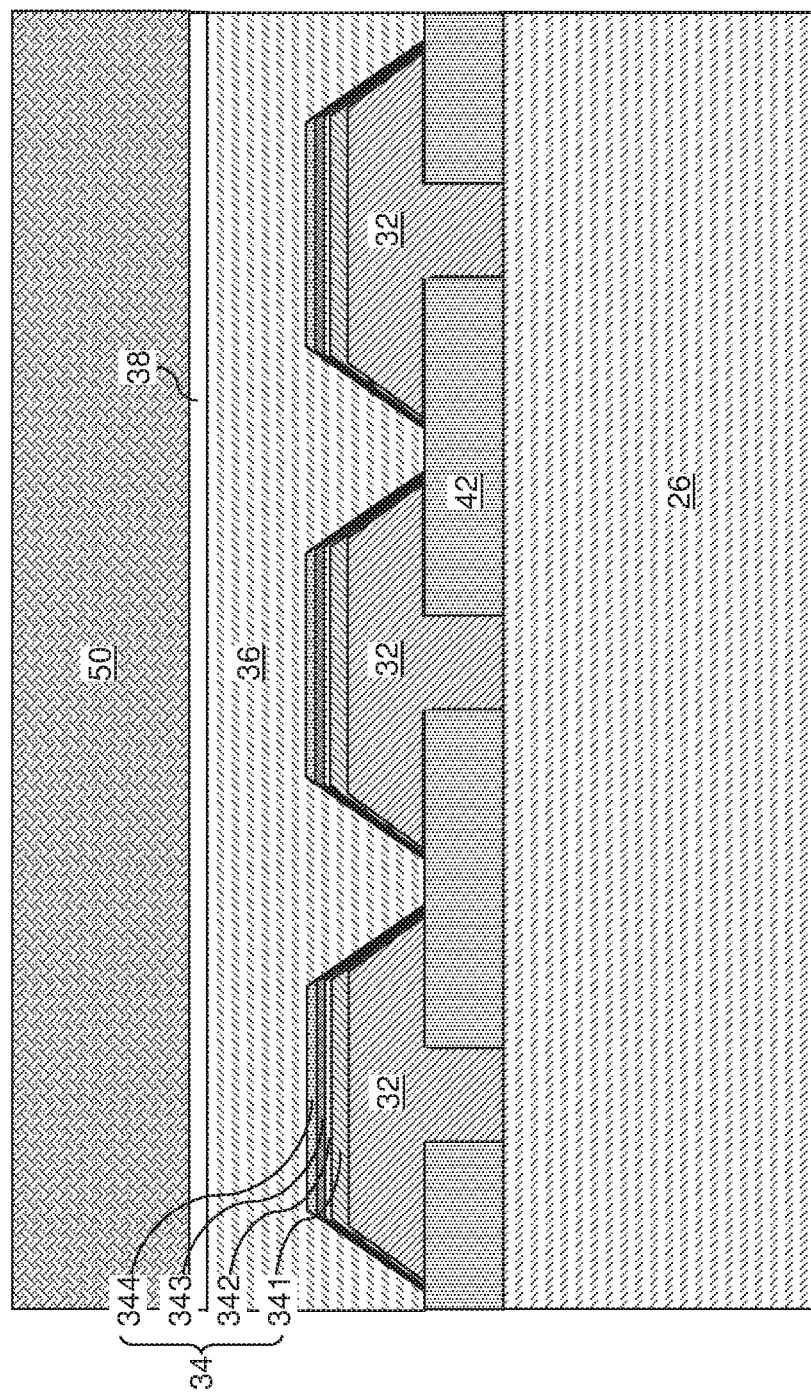
FIG. 7 is a vertical cross-sectional view of a region of the first exemplary structure after formation of a second conductivity type semiconductor material layer, a transparent conductive layer, and a top contact electrode according to the first embodiment of the present disclosure.

Referring to FIG. 7, a second conductivity type semiconductor material layer 36 is formed on the planar top surfaces and faceted outer surfaces of the active regions 34. The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The second conductivity type semiconductor material layer 36 can include a compound semiconductor material. The compound semiconductor material of the second conductivity type semiconductor material layer 36 can be any suitable semiconductor material, such as p-type III-nitride compound semiconductor material, e.g., gallium nitride and/or aluminum gallium nitride. In one embodiment, the nanofrustums 32F can include n-doped GaN or InGaN, and the second conductivity type semiconductor material layer 36 can include p-doped AlGaN and/or GaN.

The second conductivity type semiconductor material layer 36 can be formed by selective deposition of the doped semiconductor material on the outer surfaces of the active regions 34. For example, a selective epitaxy process can be employed. During the selective deposition process (which can be a selective epitaxy process), discrete semiconductor material portions grow from the outer surfaces of each of the active regions until the discrete semiconductor material portions merge to form the second conductivity type semiconductor material layer 36 as a continuous semiconductor material layer in each cluster 44. In case portions of the top surface of the growth mask layer 42 are not covered by the nanofrustums 32F or the active regions 34, the bottom surface of the second conductivity type semiconductor material layer 36 can contact such portions of the top surface of the growth mask layer 42. In one embodiment, each cluster 44 of nanofrustums 32F, active regions 34, and a second conductivity type semiconductor material layer 36 comprises at least one in-process subpixel (10G, 10B or 10R) of a direct view display device, which may be a single subpixel or a plurality of subpixels. Each second conductivity type semiconductor material layer 36 over a cluster 44 of active regions 34 (which may be a two-dimensional periodic array of active regions 34 within a corresponding area) contacts the planar top surface and sidewalls of each active region 34 within the cluster 44.

An optional transparent conductive layer 38, such as a transparent conductive layer can be deposited over the horizontally extending portion of the second conductivity type semiconductor material layer 36. The transparent conductive layer 38 includes a transparent conductive oxide material, as indium tin oxide, aluminum doped zinc oxide, or another suitable material, such as a nickel oxide and gold composite. The transparent conductive layer 38 can be deposited as a continuous material layer that extends across the entire area of the second conductivity type semiconductor material layer 36, i.e., across the entire area of each cluster 44, and in the inter-cluster region 45. The thickness of the transparent conductive layer 38 can be in a range from 5 nm to 600 nm, such as from 10 nm to 300 nm, although lesser and greater thicknesses can also be employed.

Alternatively, the transparent conductive layer 38 may be replaced with a silver layer, which can be deposited by physical vapor deposition and annealed to provide a contact to a p-type semiconductor material. In this case, the silver layer can function as a reflector material layer and subsequent deposition of a reflector material layer can be omitted.

A metallic material is deposited on the top surface of the transparent conductive layer 38. The metallic material can include a reflective metal such as aluminum, silver, copper, and/or gold. The metallic material can be deposited, for example, by sputtering. The average thickness of the deposited metallic material can be in a range from 50 nm to 500 nm, although lesser and greater thicknesses can also be employed. A photoresist layer (not shown) can be applied over the metallic material, and can be lithographically patterned to cover a center portion of each sub-pixel to be subsequently formed. An etch process can be performed to remove unmasked portions of the metallic material employing the photoresist layer as an etch mask. The etch process can be an isotropic etch process or an anisotropic etch process, and may, or may not, be selective to the materials of the transparent conductive layer 38. Each remaining portion of the metallic material that is patterned by the etch process constitutes a top contact electrode 50. The top contact electrode 50 may be reflective and function as a reflector. The photoresist layer is subsequently removed, for example, by ashing.

Optionally, at least one metallic (i.e., electrically conductive) barrier layer (not shown) can be formed as a component of the top contact electrode 50. In this case, the at least one metallic barrier layer can be located at a top surface of the top contact electrode 50, and can be employed to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed.

Referring to FIG. 8, a photoresist layer (not shown) can be applied over each top contact electrode 50 and the transparent conductive layer 38, and can be lithographically patterned to cover an entire area of each sub-pixel to be subsequently formed. An anisotropic etch process can be performed to sequentially etch unmasked portions of the transparent conductive layer 38, the second conductivity type semiconductor material layer 36, the semiconductor nanostructures 32, the active regions 34, the patterned growth mask layer 42, the doped compound semiconductor layer 26, and the buffer layer 24 employing the photoresist layer as an etch mask. The support substrate 22 can be employed as an etch stop structure. Each set of adjacent remaining portions of the transparent conductive layer 38, the second conductivity type semiconductor material layer 36, the semiconductor nanostructures 32, the active regions 34, the patterned growth mask layer 42, the doped compound semiconductor layer 26, and the buffer layer 24 collectively constitute a mesa structure. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each mesa structure. Sidewalls of the semiconductor structures 32, if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same mesa structure. The photoresist layer is subsequently removed, for example, by ashing.

A dielectric material layer 60 may be deposited over the transparent conductive layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. The dielectric material layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric material layer 60 can be formed over each mesa structure, and encapsulates each mesa structure in combination with the support substrate 22. In one embodiment, the dielectric material layer 60 can be formed as a conformal material layer, i.e., a layer having a uniform thickness throughout. The thickness of the dielectric material layer 60 can be in a range from 100 nm to 4 microns, such as from 200 nm to 2 microns, although lesser and greater thicknesses can also be employed.

A photoresist layer (not shown) can be applied over the exemplary structure, and can be lithographically patterned to cover a center portion of each mesa structure, and not to cover an entire periphery of each mesa structure. Portions of the surfaces of the support substrate 22 located between a neighboring pair of mesa structures can be covered with the patterned photoresist layer. In one embodiment, the uncovered areas of the exemplary structure can include annular regions located at a periphery of each mesa structure. The annular regions can be laterally spaced from one another by remaining portions of the photoresist layer that cover underlying portions of the support substrate 22. In one embodiment, the sidewalls of the patterned photoresist layer can have a retro-taper to minimize deposition of a metallic material in a subsequent metallic material deposition process.

A reflector material can be deposited over the dielectric material layer 60 in regions that are not covered with the photoresist layer. The reflector material can be deposited by a direction deposition method such as vacuum evaporation or physical vapor deposition. Each portion of the reflector material that is deposited directly on the dielectric material layer 60 constitutes a reflector layer 70, which can be topologically homeomorphic to a ring. In one embodiment, each reflector layer 70 includes a reflective material such as a metal. In one embodiment, each reflector layer 70 includes at least one material selected from silver, aluminum, copper, and gold. In one embodiment, the reflector material can be a thin film distributed Bragg reflector (DBR) with small index changes to provide better reflectivity. The reflector material can include at least one conductive material and/or at least one electrically insulating material.

Reflector material portions are formed on the top surfaces of the patterned portions of the photoresist layer. The thickness of horizontal portions of the reflector layer 70 can be in a range from 5 nm to 500 nm, such as from 10 nm to 250 nm, although lesser and greater thicknesses can also be employed. The remaining portions of the photoresist layer and the reflector material portions thereupon can be lifted off the exemplary structure, for example, by dissolving the photoresist layer in a solvent.

An etch process can be performed to etch unmasked portions of the dielectric material layer 60. The etch process may be an anisotropic etch process or an isotropic etch process. Portions of the dielectric material layer 60 that are not masked by the reflector layers 70 are removed by the etch process. The top surface of each top contact electrode 50 and the top surface of the support substrate 22 are physically exposed in each area that is not covered with the reflector layers 70. A light emitting diode (LED) 10 is provided, which includes a mesa structure, a dielectric material layer 60, and a reflector layer 70 having an annular configuration. The top surface of the top contact electrode 50 is physically exposed within a hole in the reflector layer 70, and within a hole in the dielectric material layer 60. Each LED 10 can be subsequently employed as a sub-pixel in a display device.

A conductive bonding structure 431 is formed over each mesa structure. In one embodiment, the conductive bonding structures 431 can be formed directly on the at least one metallic barrier layer, which can be a topmost layer of the top contact electrode 50. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material.

A backplane 401 is provided, which includes a backplane substrate 400 and bonding structures 421 located thereupon. A backplane can be an active or passive matrix backplane substrate for driving light emitting devices. As used herein, a "backplane substrate" refers to any substrate configured to affix multiple devices thereupon. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid. In some embodiments, active device circuits (such as field effect transistors) may not be present in the backplane substrate 400. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprise one or more transistors.

The backplane substrate 400 is disposed facing the substrate 20 (e.g., above, below or side-to-side) and aligned such that the conductive bonding structures 431 face, and contact, a respective one of the bonding structures 421. At least one of the LEDs 10 (i.e., at least one subpixel 10G, 10B or 10R) can be attached to the backplane 401 by inducing bonding between a respective pair of a conductive bonding structure 432 and a bonding structure 421 (which may be a bonding pad) on the backplane 401. Local heating (for example, by laser irradiation) of the respective pair of the conductive bonding structure 432 and the bonding structure 421 can be employed to induce reflow and bonding of the solder material. All, or only a subset, of the LEDs 10 on the substrate 20 can be bonded to the backplane 401, as will be described in more detail below with respect to FIGS. 16A to 16P. In one embodiment, each LED 10 die is subpixel (10B, 10G or 10R) that emits light of a given color, which may be, for example, blue, green, or red.

Figure 9A:
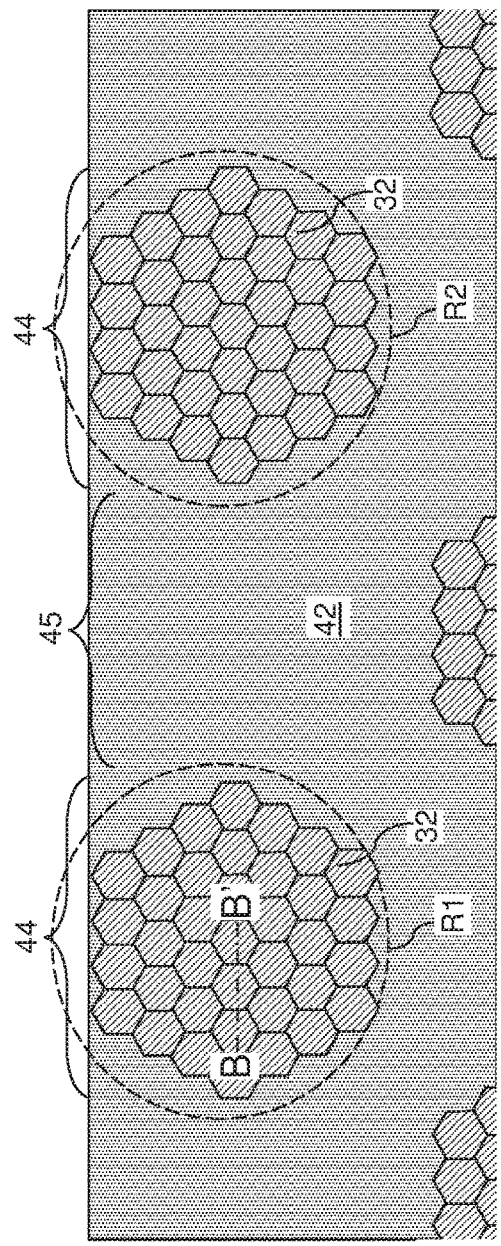
FIG. 9A is a plan view of a second exemplary structure after an anneal process that forms arrays of semiconductor nanostructures including nanofrustums and pillar portions according to a second embodiment of the present disclosure.
Figure 9B:
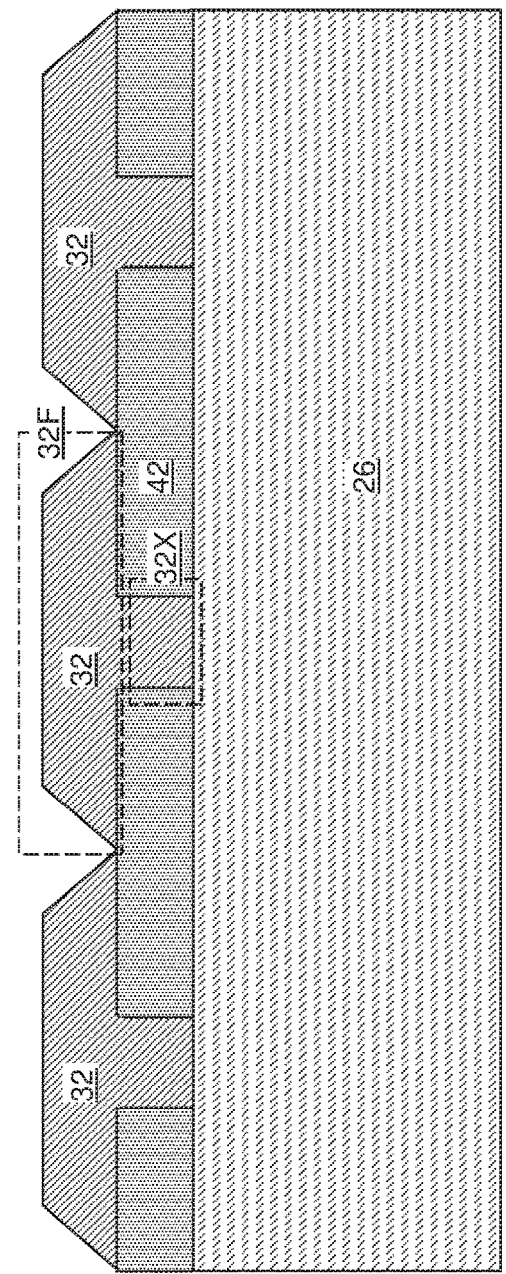
FIG. 9B is a vertical cross-sectional view of the first exemplary structure of FIG. 9A along the vertical plane B-B'.

In a second embodiment, the etching step shown in FIGS. 4A and 4B may be omitted, and the anneal process is used to planarize the nanopyramid 32Y tops. Referring to FIGS. 9A and 9B, a second exemplary structure according to the second embodiment of the present disclosure can be derived from the first exemplary structure of FIGS. 3A-3C by performing an anneal process. The anneal process induces rearrangement of the material of the nanopyramids 32Y at least through surface diffusion, and preferably but optionally through bulk diffusion. The rearranged material of the nanopyramids 32Y is converted into nanofrustums 32F. Arrays of semiconductor nanostructures 32 including nanofrustums 32F and pillar portions 32X can be formed.

Each nanofrustum 32F can have a bottom surface, a top surface, tapered planar sidewalls, and a height that is less than a maximum lateral dimension TMLD of the top surface. Generally, the nanofrustums 32F of the second embodiment can have the same geometrical features as the nanofrustums 32F of the first embodiment illustrated in FIGS. 5A-5C. In one embodiment, the top surface of each remaining portion of the nanopyramids 32Y can be reconstructed into a respective c-plane crystallographic facet, and the tapered sidewalls of each remaining portion of the nanopyramids 32Y can be reconstructed into a respective set of p-plane crystallographic facets. Bottom edges of the p-plane crystallographic facets can contact the top surface of the growth mask layer 42. Top edges of the p-plane crystallographic facets of each nanofrustum 32F can contact sides of a c-plane crystallographic facet of the nanofrustum 32F. Side edges of the p-plane crystallographic facets of each nanofrustum 32F can be adjoined among one another.

In the second embodiment, without wishing to be bound by a particular theory, the inventors believe that the anneal process can induce expansion of the lateral extent of each nanopyramid 32Y so that the extent of each nanofrustum 32F is greater than the lateral extent of the nanopyramid 32Y from which the nanofrustum 32F is derived. In one embodiment, the nanofrustums 32F can be arranged as a two-dimensional array, and bottom edges of tapered planar sidewalls of the nanofrustums 32F can be in direct contact among one another or can be spaced apart, and can contact the top surface of the growth mask layer 42. In this case, an entire area enclosed by bottom edges of outermost nanofrustums 32F can be covered by the nanofrustums 32F. In an alternative embodiment, the openings 43 through the growth mask layer 42 can be formed without any inter-cluster region 45, and the entire top surface of the growth mask layer 42 can be completely covered by the nanofrustums 32F after the anneal process.

In an illustrative example, the ambient of the anneal process can include ammonia, and can optionally include an inert gas such as nitrogen. The elevated temperature of the anneal process can be in a range from 950 degrees Celsius to 1,250 degrees Celsius, such as from 1,050 degrees Celsius to 1,200 degrees Celsius. The duration of the elevated temperature under the ambient can be in a range from 1 minute to 2 hours, such as from 2 minutes to 1 hours, although shorter and longer durations can also be employed.

A plurality of semiconductor nanostructures 32 including nanofrustums 32F and pillar portions 32X is formed. In one embodiment, the plurality of semiconductor nanostructures 32 can include arrays of semiconductor nanostructures 32 that are formed in clusters. The plurality of semiconductor nanostructures 32 can have a doping of the first conductivity type, and is formed through, and over, the growth mask layer 43. Each of the plurality of semiconductor nanostructures 32 can include a nanofrustum 32F, and a pillar portion 32X contacting the bottom surface of the nanofrustum 32F and located within a respective one of the openings through the growth mask layer 42. In one embodiment, each of the tapered planar sidewalls includes a respective crystallographic p-plane. In one embodiment, each of the nanofrustums 32F is a hexagonal nanofrustum, i.e., a nanofrustum having a hexagonal base shape. In one embodiment, the nanofrustums 32F are arranged as a two-dimensional array and are in direct contact among one another.

Referring to FIG. 10, the processing steps of FIG. 6 can be performed to form a plurality of active regions 34 on the nanofrustums 32F. The active regions 34 of the second embodiment may be the same as the active regions 34 of the first embodiment. In one embodiment, each of the plurality of active regions 34 can include a respective optically active compound semiconductor layer stack configured to emit light at a target peak wavelength.

Figure 11:
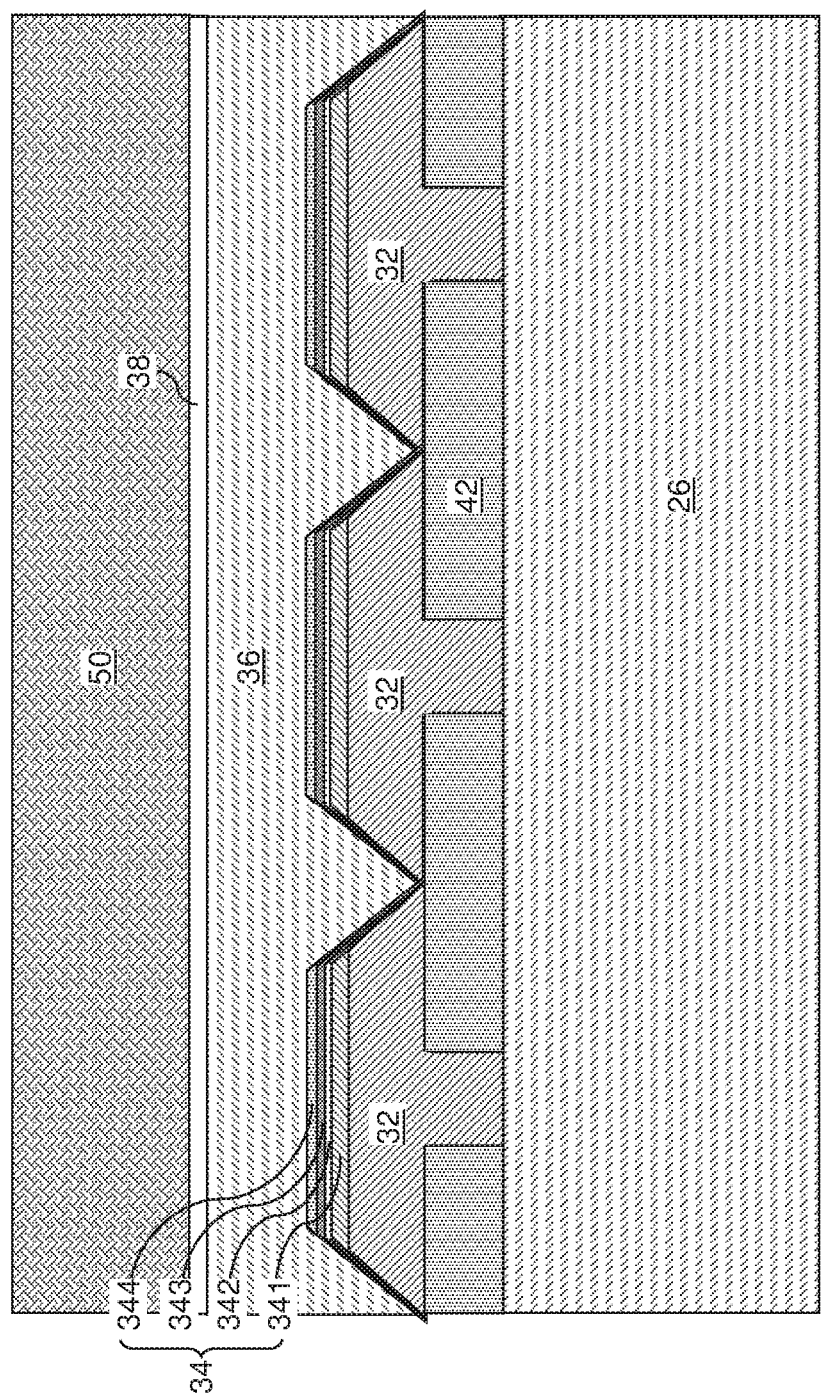
FIG. 11 is a vertical cross-sectional view of a region of the second exemplary structure after formation of a second conductivity type semiconductor material layer, a transparent conductive layer, and a top contact electrode according to the second embodiment of the present disclosure.

Referring to FIG. 11, the processing steps of FIG. 7 can be performed to form a second conductivity type semiconductor material layer 36, a transparent conductive layer 38, and a top contact electrode 50. Subsequently, the processing steps of FIG. 8 can be performed to form light emitting devices 10, and to attach at least a subset of the light emitting devices 10 to a backplane 401.

Figure 12A:
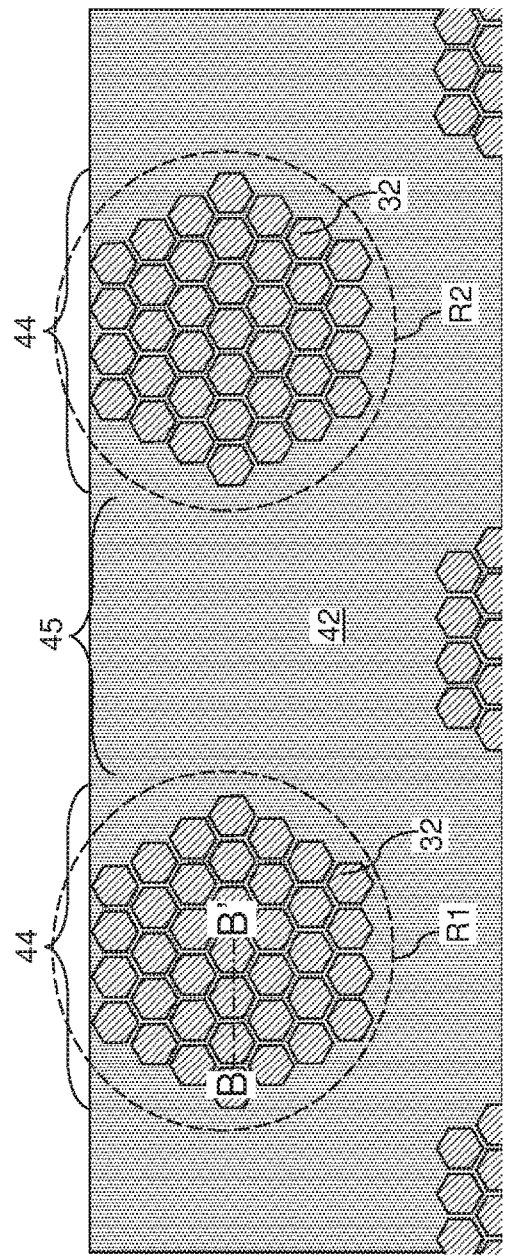
FIG. 12A is a plan view of a third exemplary structure after a compound semiconductor material growth process that forms arrays of semiconductor nanostructures including nanofrustums and pillar portions according to a third embodiment of the present disclosure.
Figure 12B:
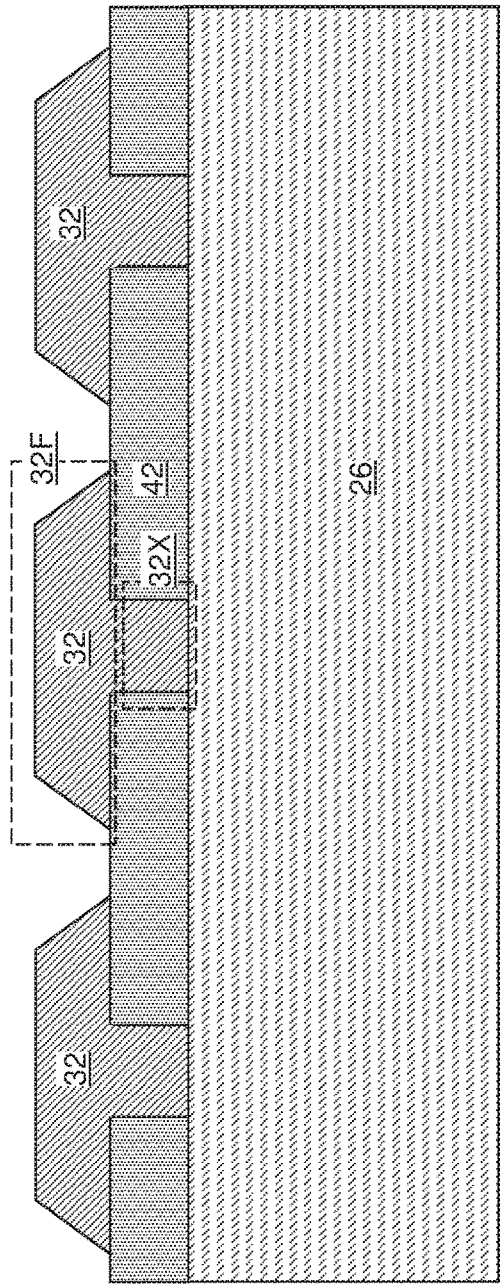
FIG. 12B is a vertical cross-sectional view of the first exemplary structure of FIG. 9A along the vertical plane B-B'.

In a third embodiment, the nanofrustums 32F instead of the nanopyramids 32Y are formed after growth of the nanostructures 32, and the etching step shown in FIGS. 4A and 4B may be omitted. Referring to FIGS. 12A and 12B, a third exemplary structure according to the third embodiment of the present disclosure can be derived from the first exemplary structure of FIGS. 2A and 2B by growing a compound semiconductor material from physically exposed surfaces of the doped compound semiconductor layer 26 underneath the openings 43 in the growth mask layer 42. After pillar portions 32X are formed in the openings 43 in the growth mask layer 42, the growth mode can be changed to suppress growth of the compound semiconductor material along the direction perpendicular to the c-plane, while promoting growth of the compound semiconductor material on the p-plane facets of the compound semiconductor material. Under such a growth mode, the compound semiconductor material can be grown into the plurality of semiconductor nanostructures 32, each including a pillar portion 32X and a nanofrustum 32F. The compound semiconductor material growth process can form arrays of semiconductor nanostructures 32 including nanofrustums 32F and pillar portions 32X.

In a non-limiting illustrative example, the growth of the nanofrustums 32F instead of conventional nanowires can be effected by increasing the fill factor of the openings 43 in each cluster 44 (i.e., the percentage area of the openings 43 in the growth mask layer 42) above 10%, such as 11% to 15%, for example 12 to 14%, while reducing the maximum lateral dimension (such as the diameter) of the openings 43 below 200 nm. For example, the maximum lateral dimension of the openings 43 in the growth mask layer 42 can be in a range from 20 nm to 150 nm, although lesser and greater maximum lateral dimensions can also be employed. Without wishing to be bound by any particular theory, the inventors believe that increased percentage area of the openings 43 with respect to the entire device area may induce lateral growth of the compound semiconductor material along the directions perpendicular to the p-planes while suppressing the growth of the compound semiconductor material in the direction perpendicular to the c-plane, thereby inducing the growth of the nanofrustums 32F instead of conventional nanowires.

Each nanofrustum 32F can have a bottom surface, a top surface, tapered planar sidewalls, and a height that is less than a maximum lateral dimension TMLD of the top surface. Generally, the nanofrustums 32F of the third embodiment can have the same geometrical features as the nanofrustums 32 of the first embodiment illustrated in FIGS. 5A-5C.

A plurality of semiconductor nanostructures 32 including nanofrustums 32F and pillar portions 32X is formed. In one embodiment, the plurality of semiconductor nanostructures 32 can include arrays of semiconductor nanostructures 32 that are formed in clusters. The plurality of semiconductor nanostructures 32 can have a doping of the first conductivity type, and is formed through, and over, the growth mask layer 42. Each of the plurality of semiconductor nanostructures 32 can include a nanofrustum 32F, and a pillar portion 32X contacting the bottom surface of the nanofrustum 32F and located within a respective one of the openings 43 through the growth mask layer 42. In one embodiment, each of the tapered planar sidewalls includes a respective crystallographic p-plane (e.g., only p-plane facets 32P or a combination of p-plane facets 32P and m-plane facets 32M). In one embodiment, each of the nanofrustums 32F is a hexagonal nanofrustum, i.e., a nanofrustum having a hexagonal base shape. In one embodiment, the nanofrustums 32F are arranged as a two-dimensional array. The nanofrustums 32F may be in direct contact among one another, or may not be in direct contact among one another depending on the duration of the growth process.

Figure 13:
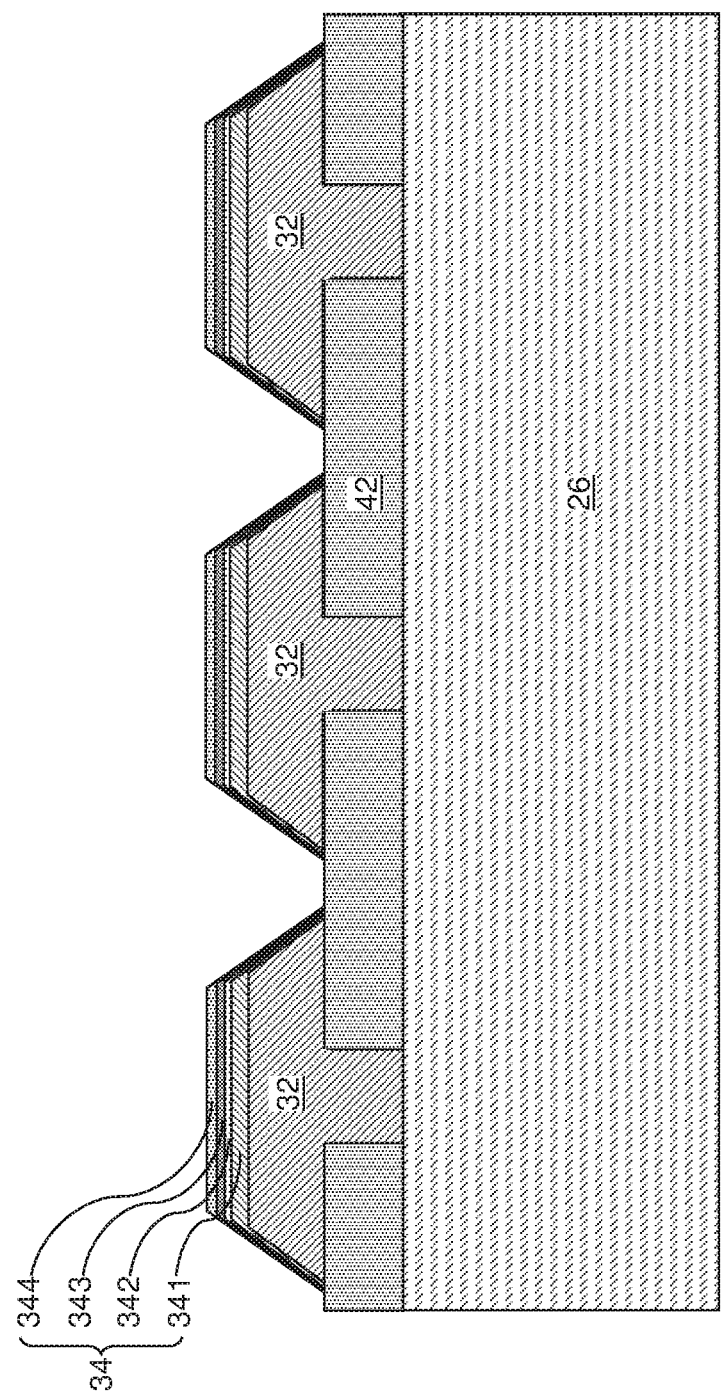
FIG. 13 is a vertical cross-sectional view of a region of the third exemplary structure after formation of active regions according to the third embodiment of the present disclosure.

Referring to FIG. 13, the processing steps of FIG. 6 can be performed to form a plurality of active regions 34 on the nanofrustums 32F. The active regions 34 of the third embodiment may be the same as the active regions 34 of the first embodiment. In one embodiment, each of the plurality of active regions 34 can include a respective optically active compound semiconductor layer stack configured to emit light at a target peak wavelength.

Figure 14:
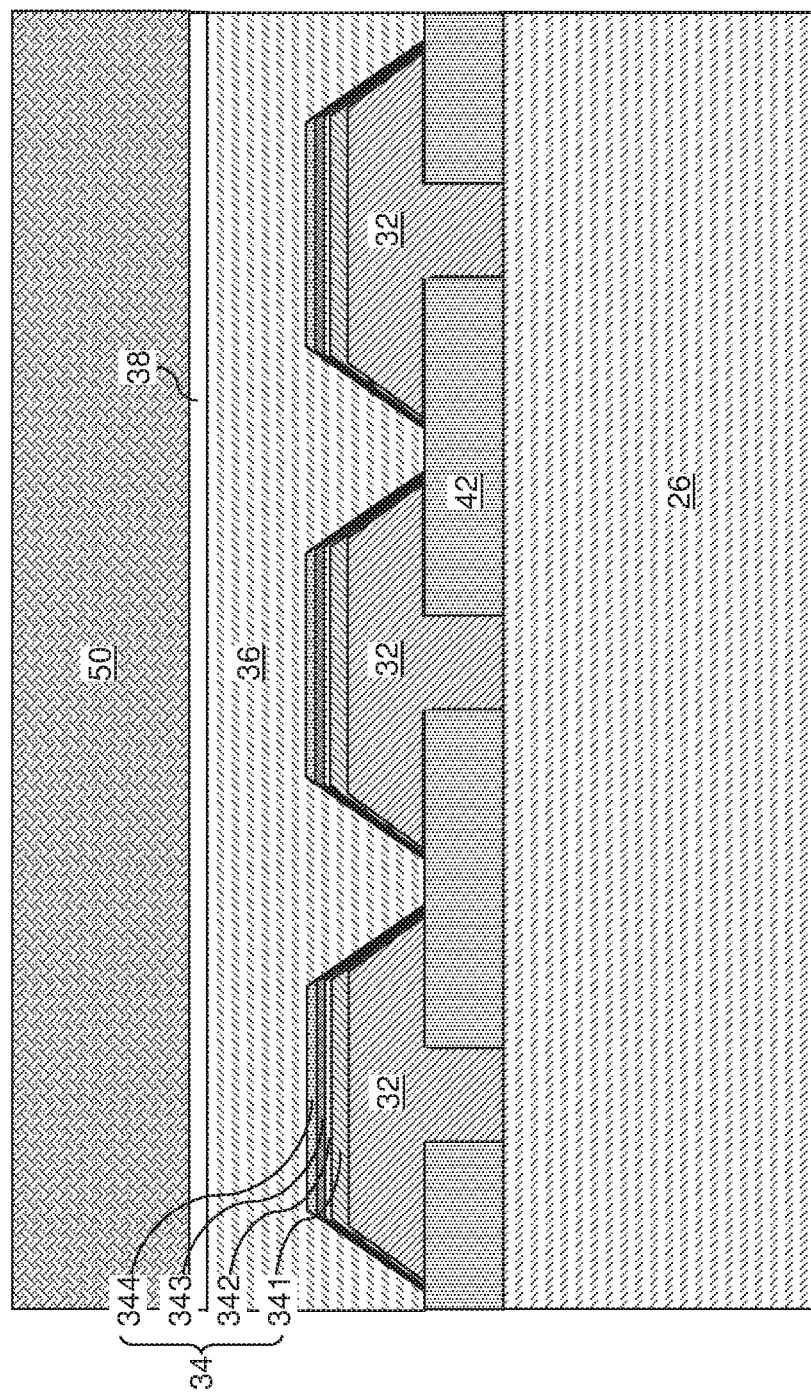
FIG. 14 is a vertical cross-sectional view of a region of the third exemplary structure after formation of a third conductivity type semiconductor material layer, a transparent conductive layer, and a top contact electrode according to the third embodiment of the present disclosure.

Referring to FIG. 14, the processing steps of FIG. 7 can be performed to form a second conductivity type semiconductor material layer 36, a transparent conductive layer 38, and a top contact electrode 50. Subsequently, the processing steps of FIG. 8 can be performed to form light emitting devices 10, and to attach at least a subset of the light emitting devices 10 to a backplane 401.

Figure 15:
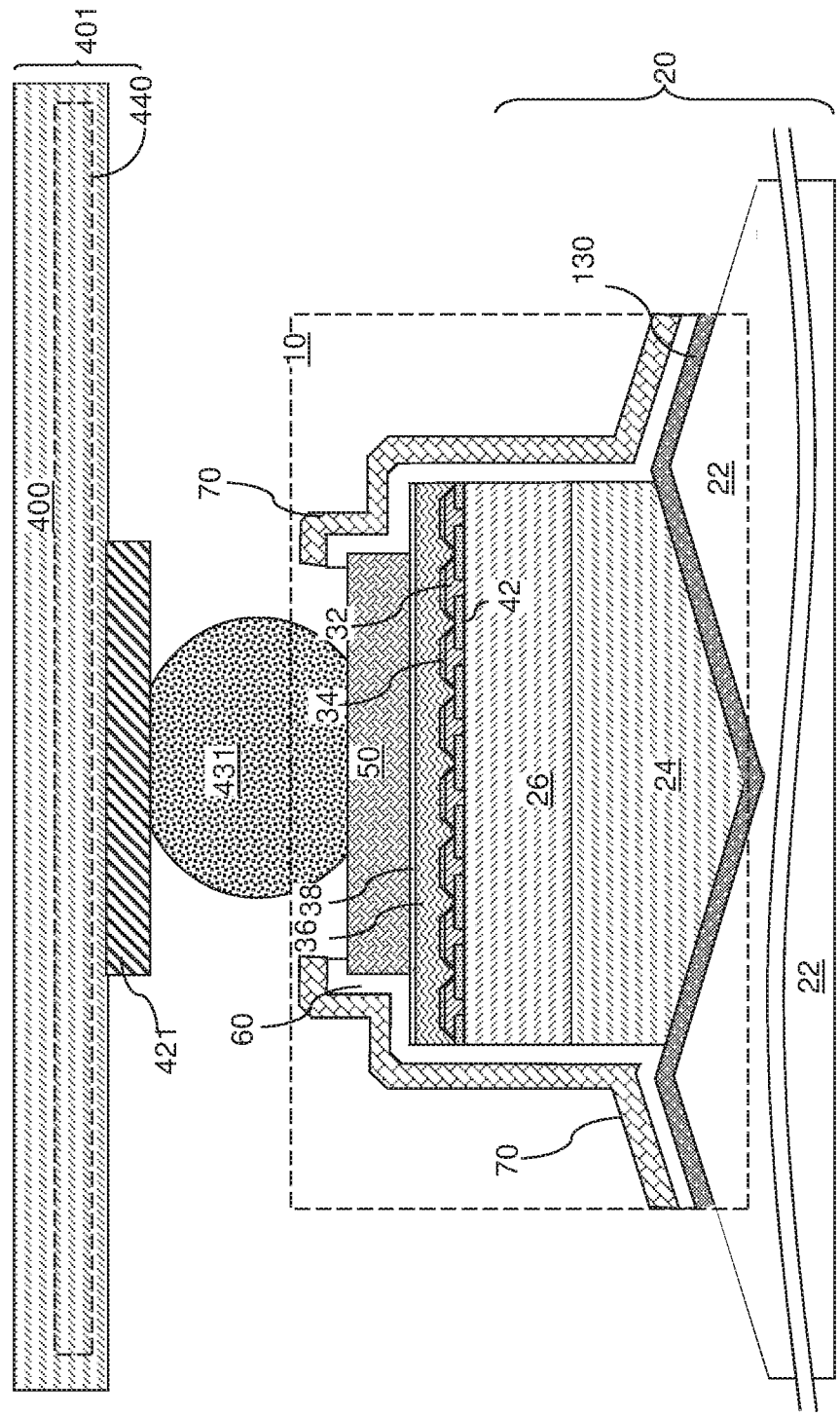
FIG. 15 is an exemplary structure including an ablation material layer according to an embodiment of the present disclosure.

Referring to FIG. 15, another exemplary structure according to an embodiment of the present disclosure is illustrated, which can be derived from the exemplary structure of FIG. 8, or any derive thereof, for example, by employing the second or third exemplary structure in lieu of the first exemplary structure, by incorporating an ablation material layer 130 as a distinct material layer into a top portion of the support substrate 22. The ablation material layer 130 can be a laser radiation absorptive insulating release layer, and can include a material such as silicon rich silicon nitride. As will be described below, if the ablation material layer 130 is not provided as a distinct material layer (as in the structure of FIG. 8), the semiconductor buffer layer 24 can function as an ablation material layer in subsequent processing steps illustrated in FIGS. 16A-16P.

The nanofrustum 32F (e.g., nanodisk) shaped pseudosubstrates may eliminate or reduce dislocations from propagating from the substrate 22 to the LEDs 10 which are formed on these pseudosubstrates, and may also decouple the substrate strain from the LEDs 10. Furthermore, InGaN pseudosubstrates improve the lattice matching for red light emitting LEDs 10 which contain a relatively high amount of indium in the InGaN layer 343 of the active region 34. This may lead to an improved performance of such LEDs 10.

Figure 16A:
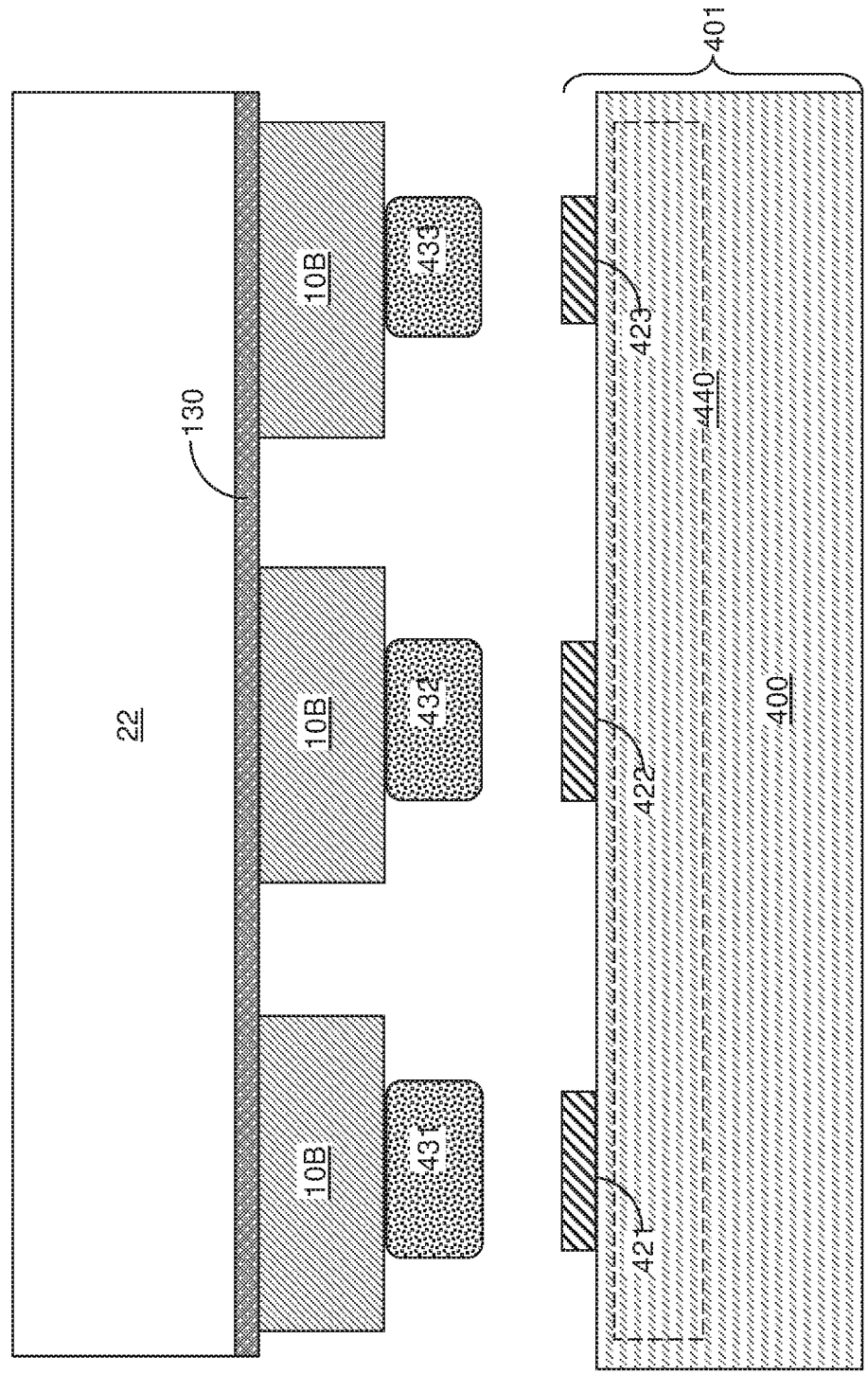
FIGS. 16A to 16P are schematic vertical cross-sectional views of steps in a method of incorporating LEDs into a display panel according to an embodiment of the present disclosure.
Figure 16B:
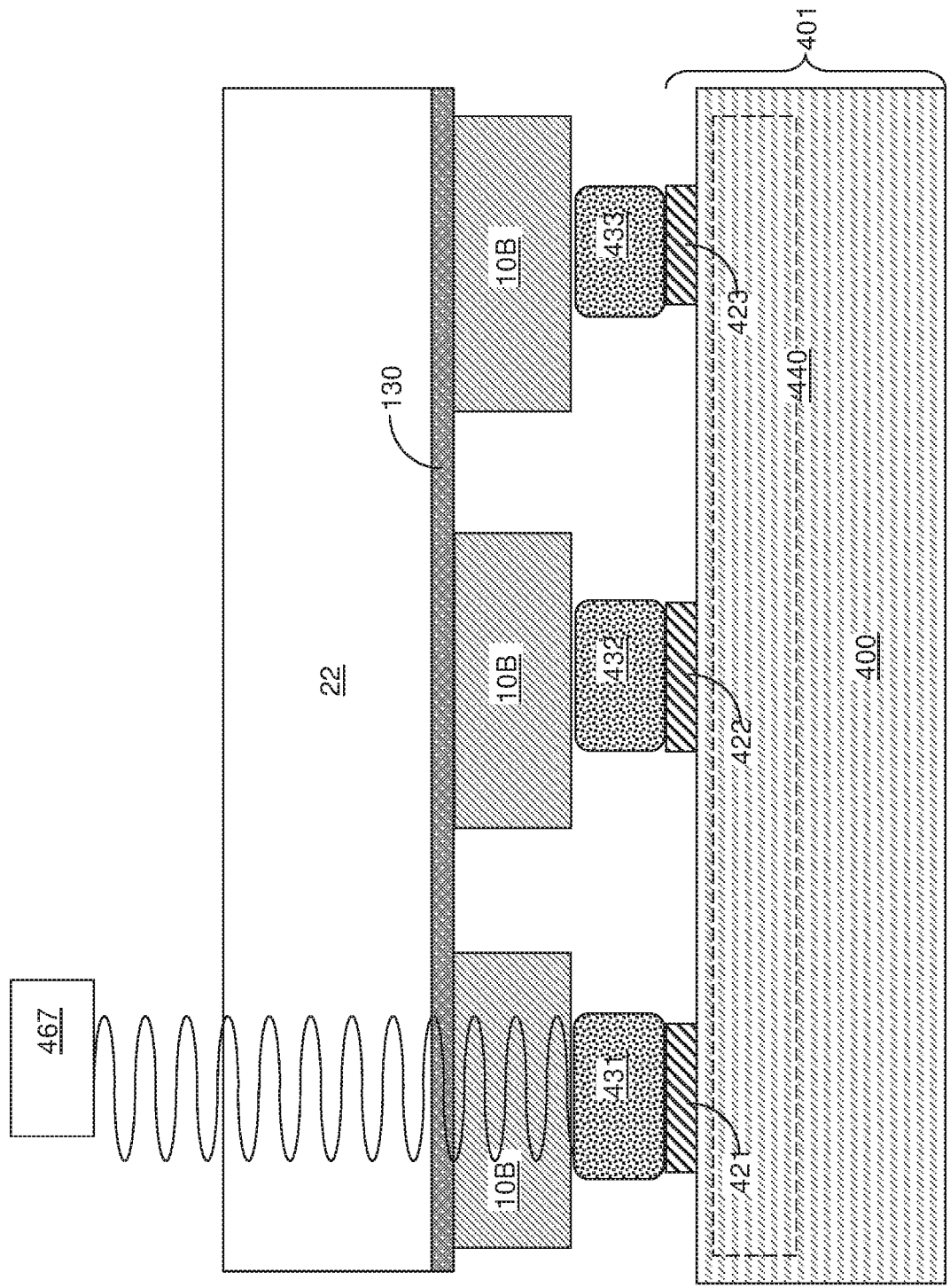
Figure 16C:
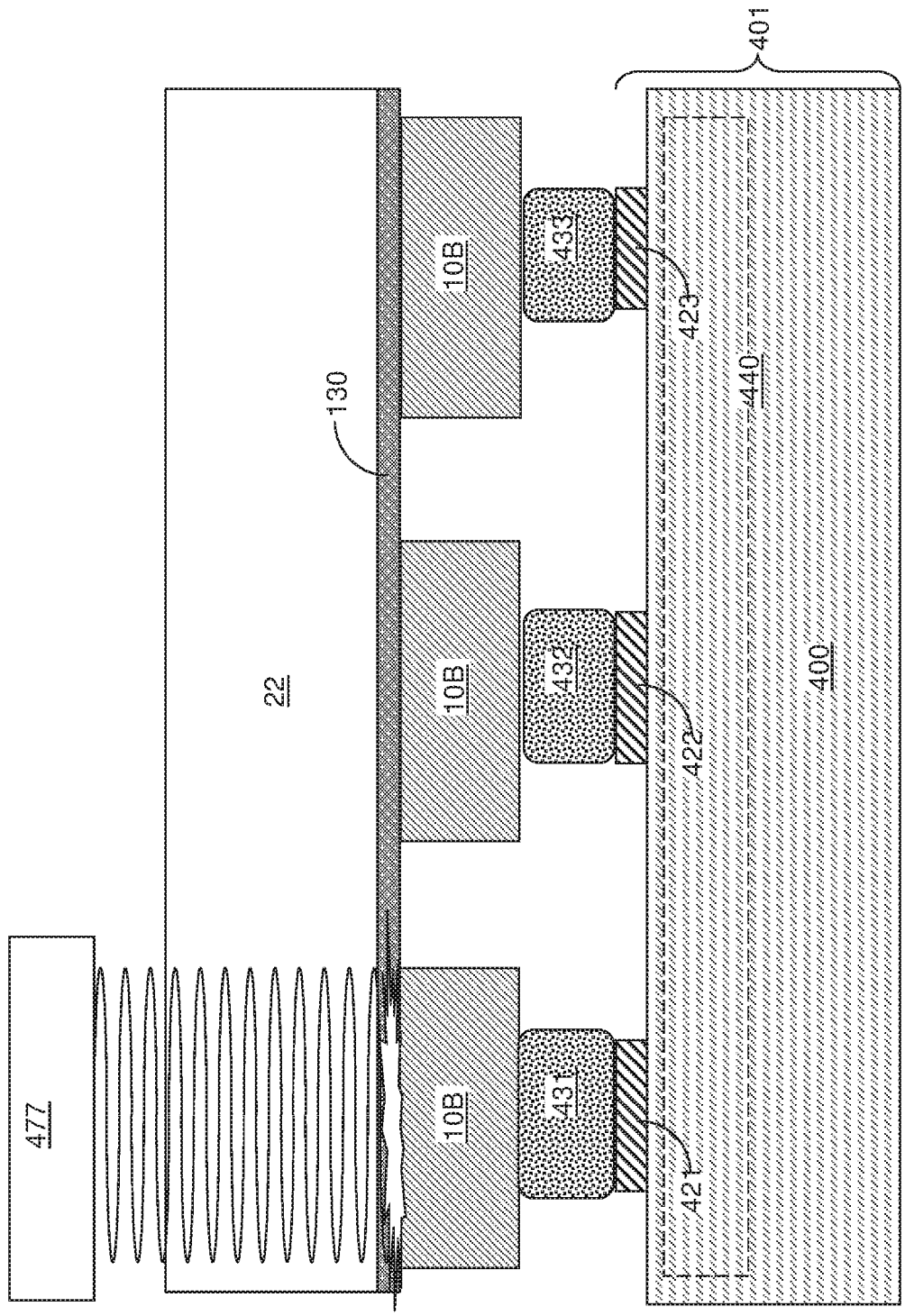
Figure 16D:
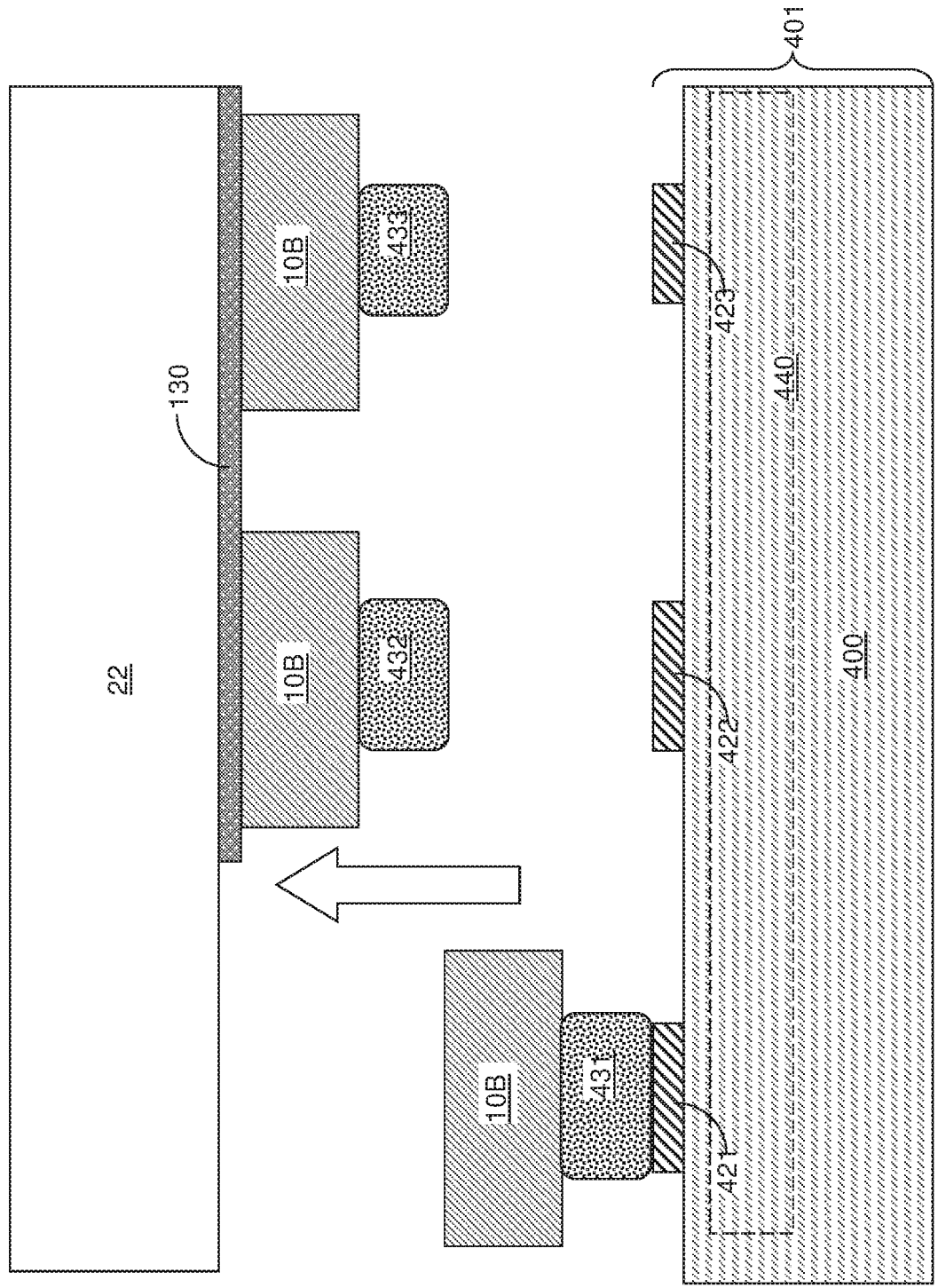
Figure 16F:
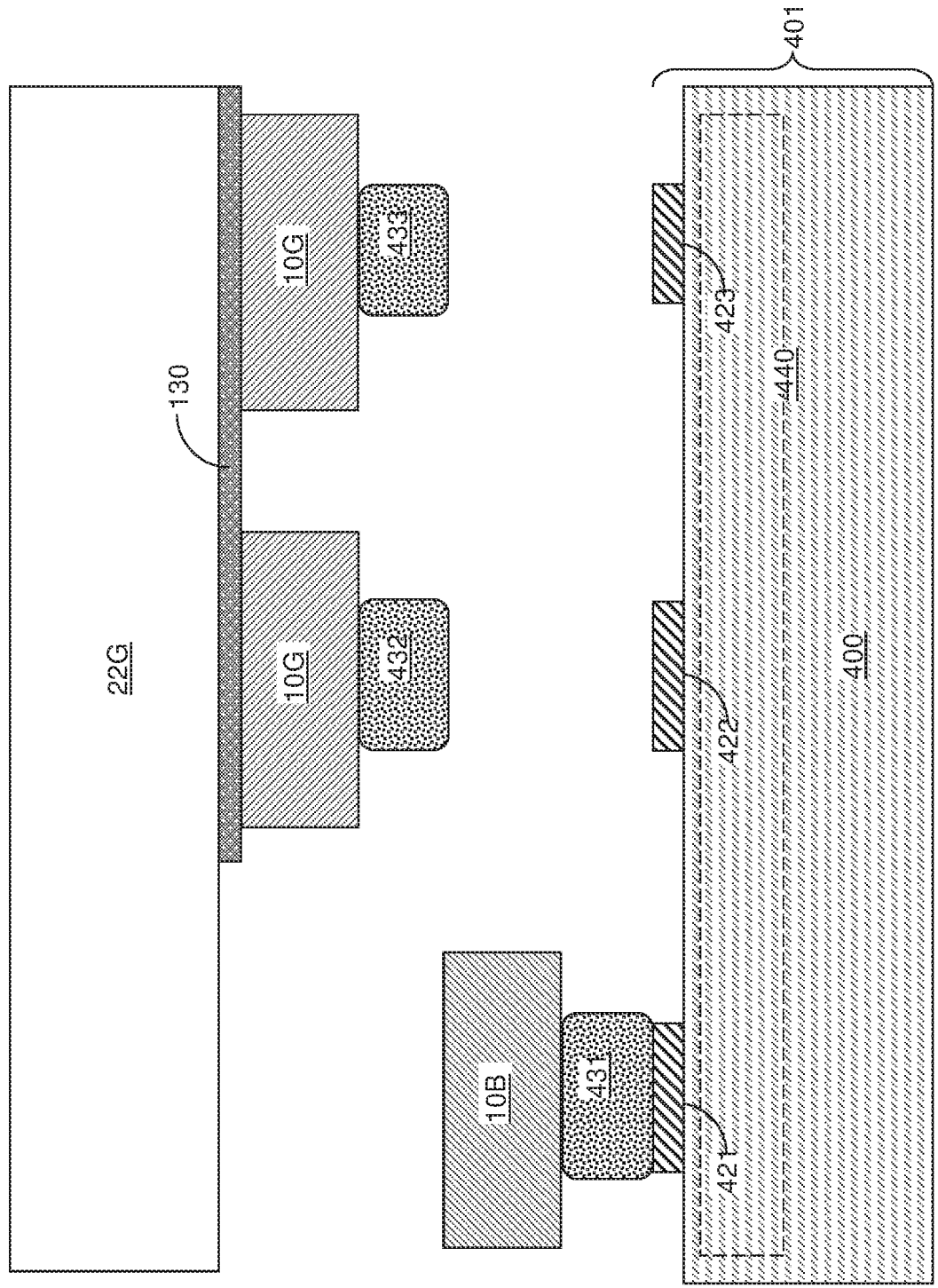
Figure 16H:
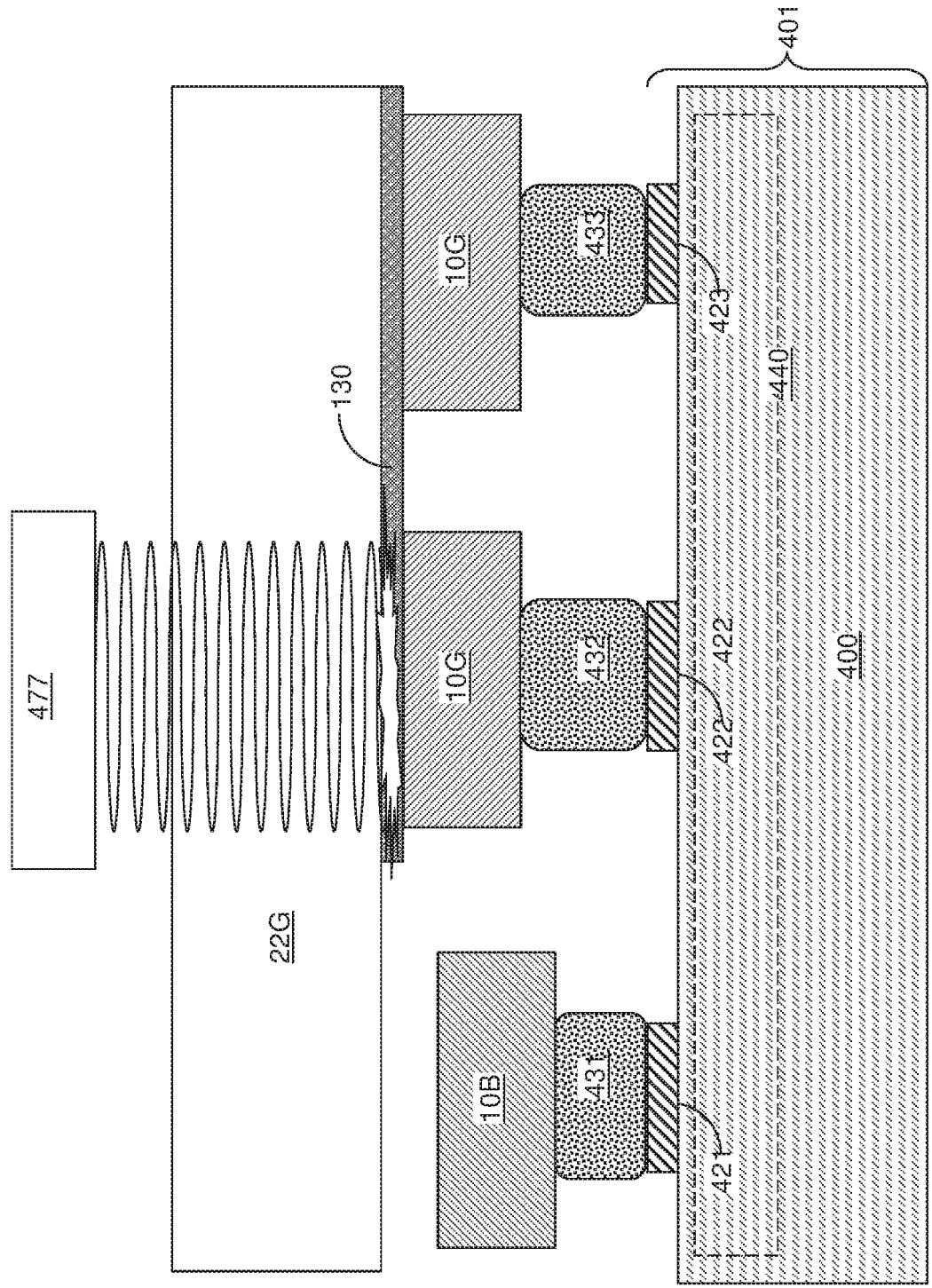
Figure 16I:
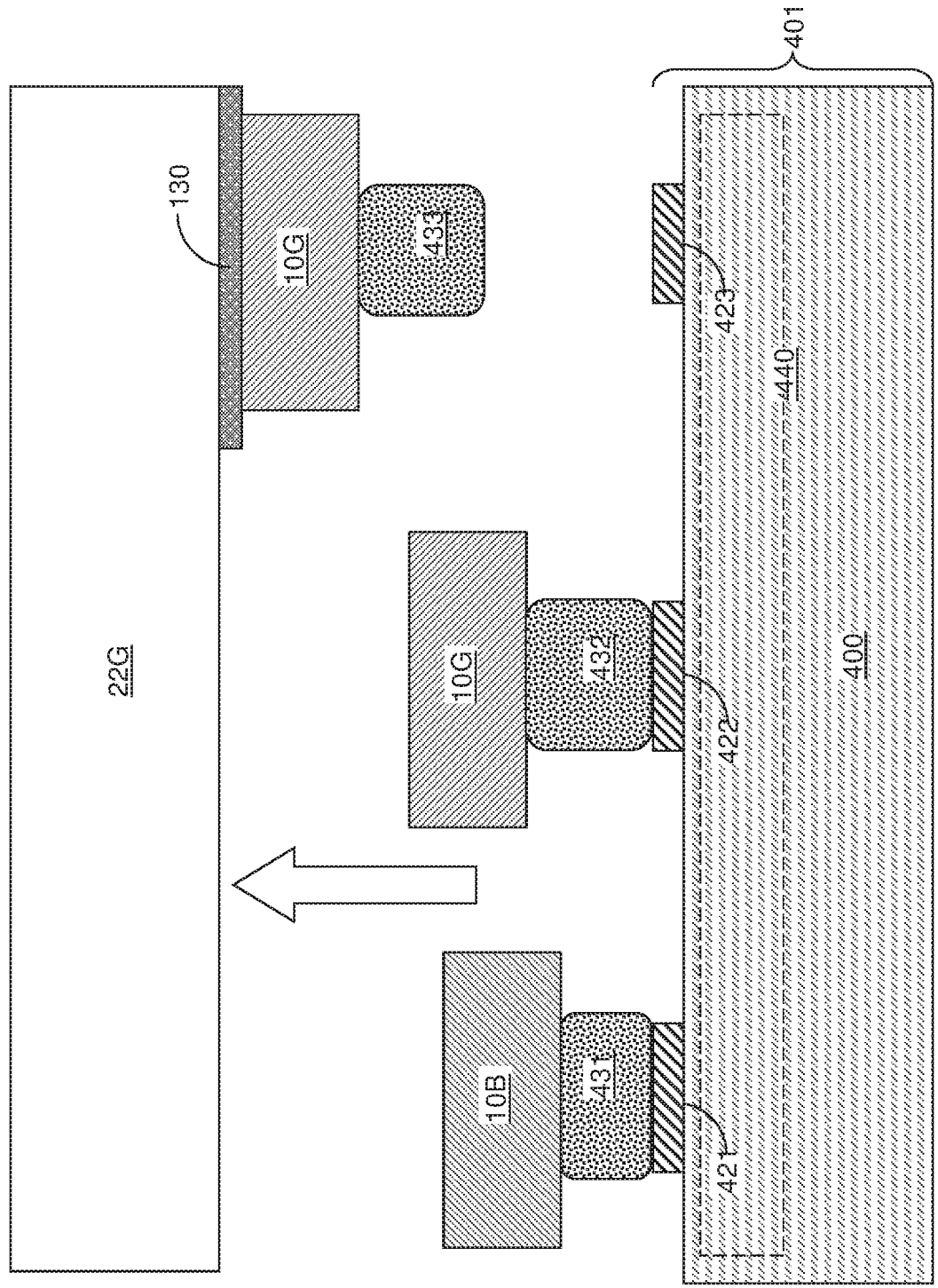
Figure 16J:
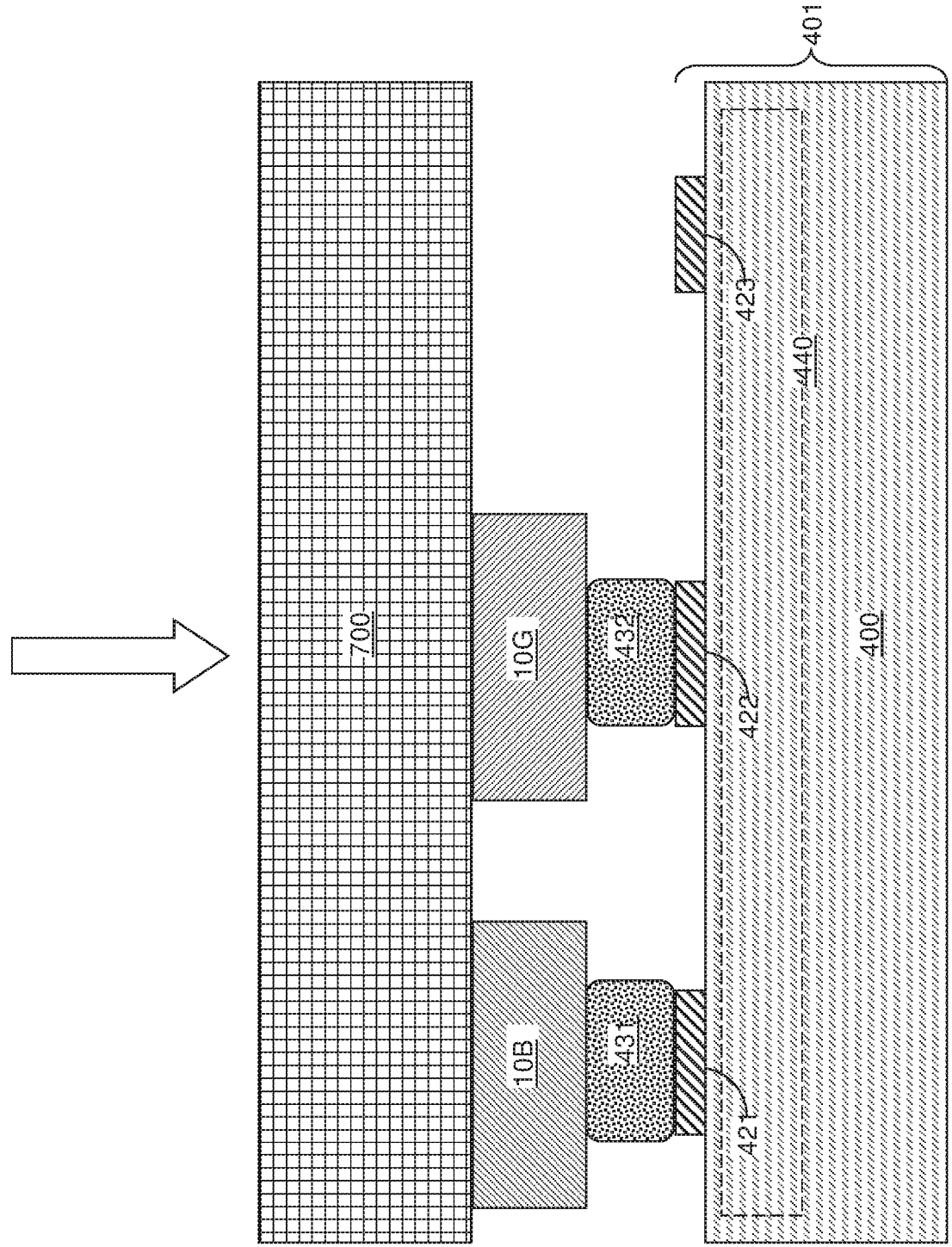
Figure 16K:
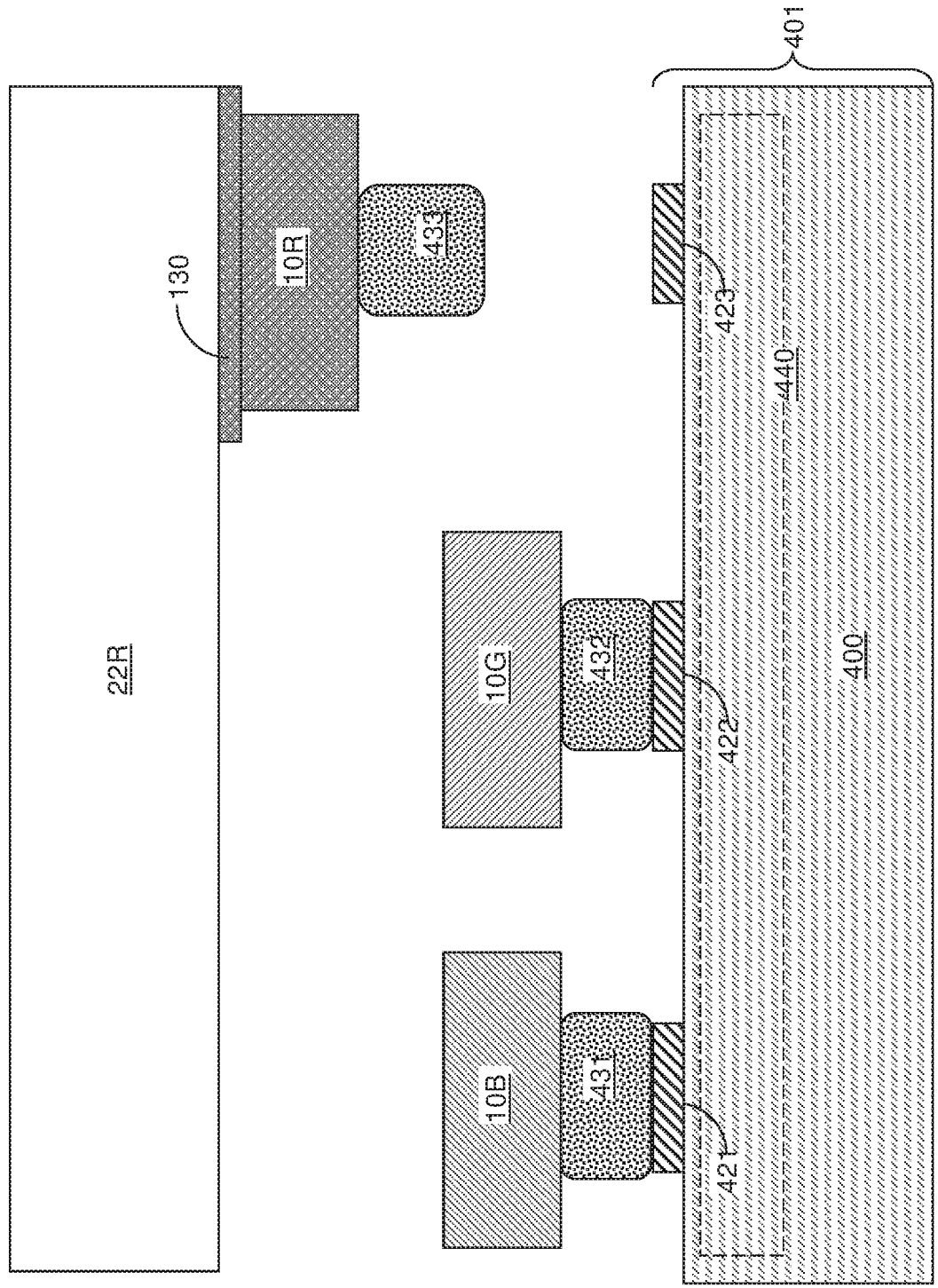
Figure 16L:
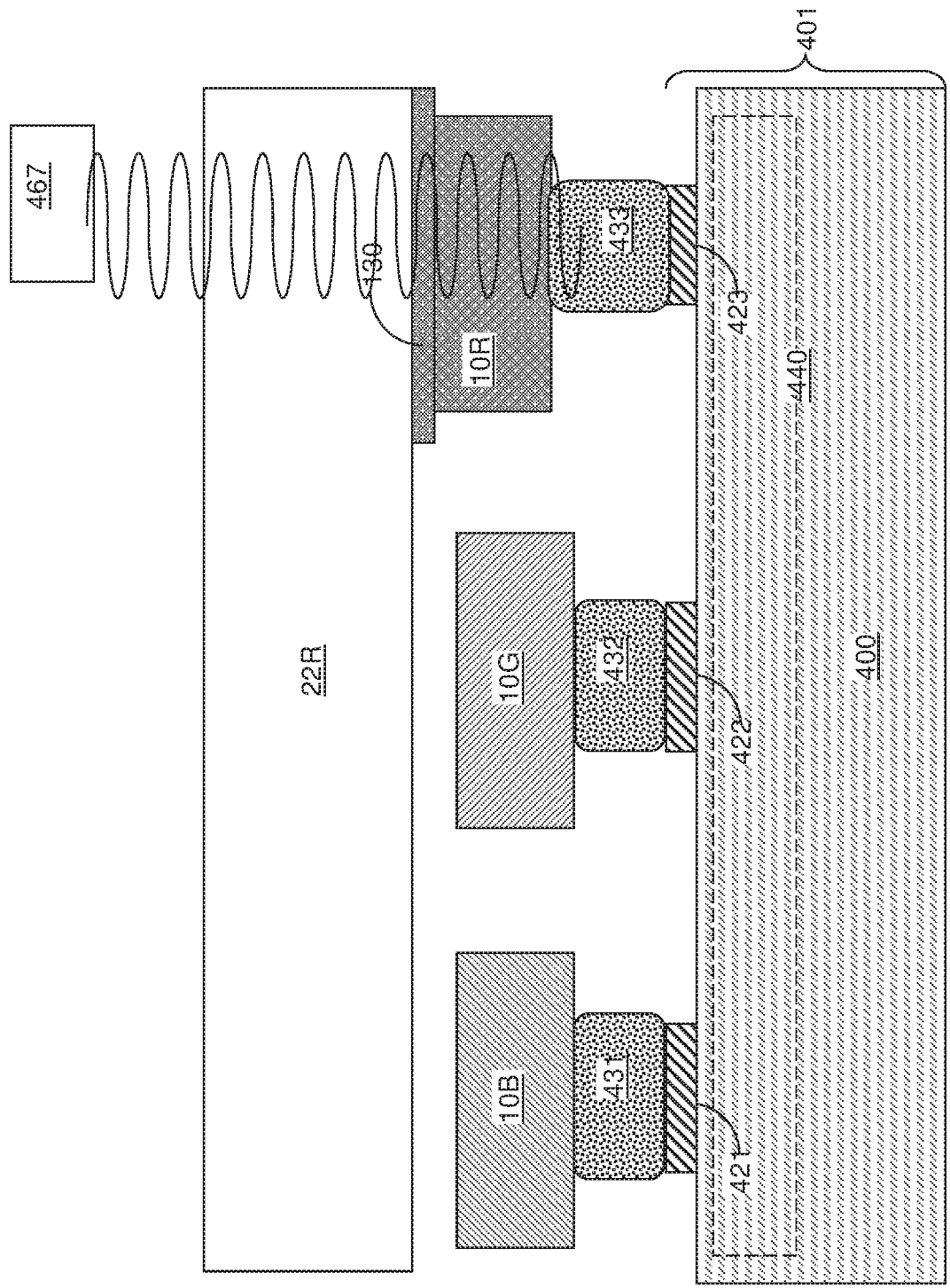
Figure 16M:
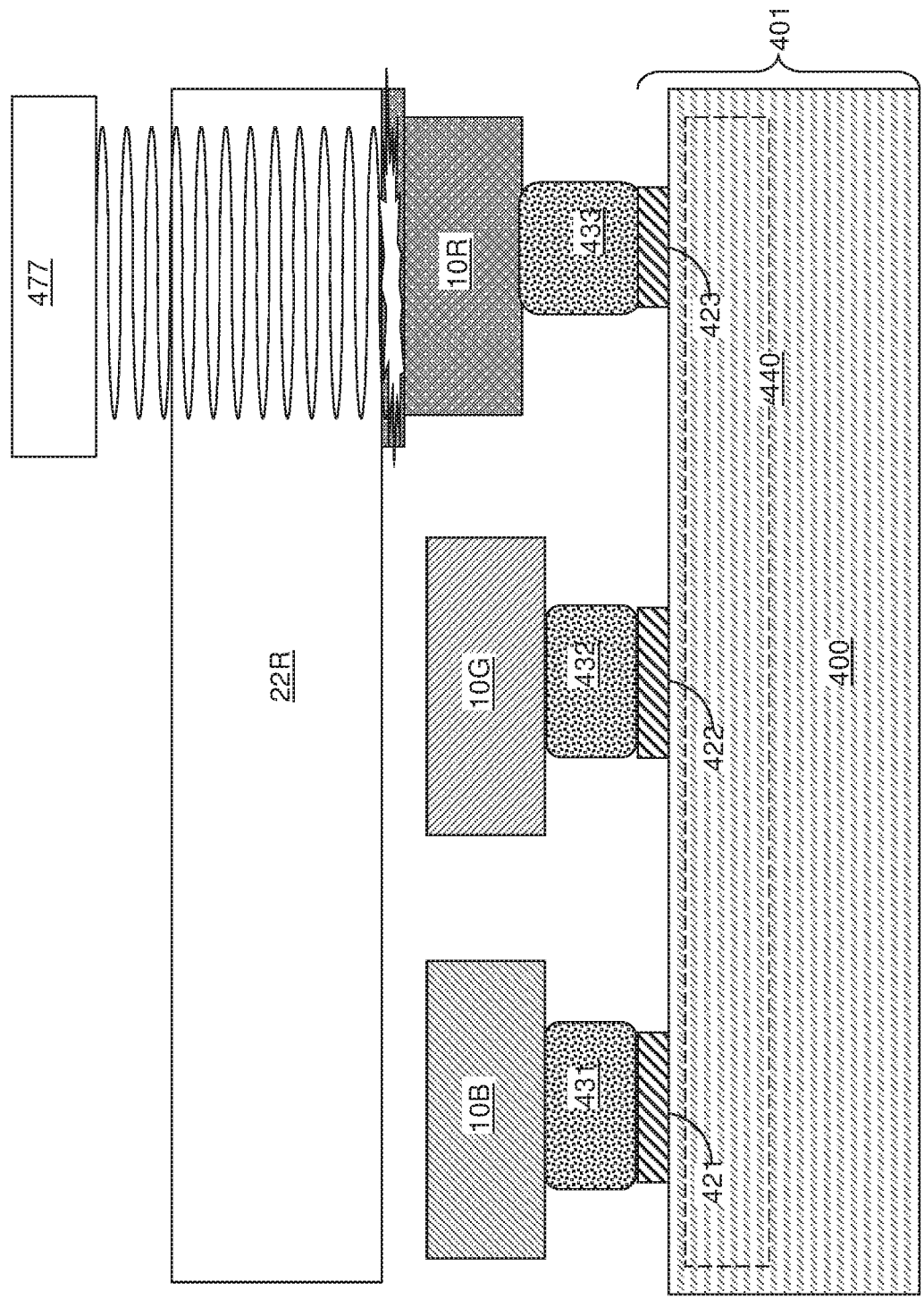
Figure 16N:
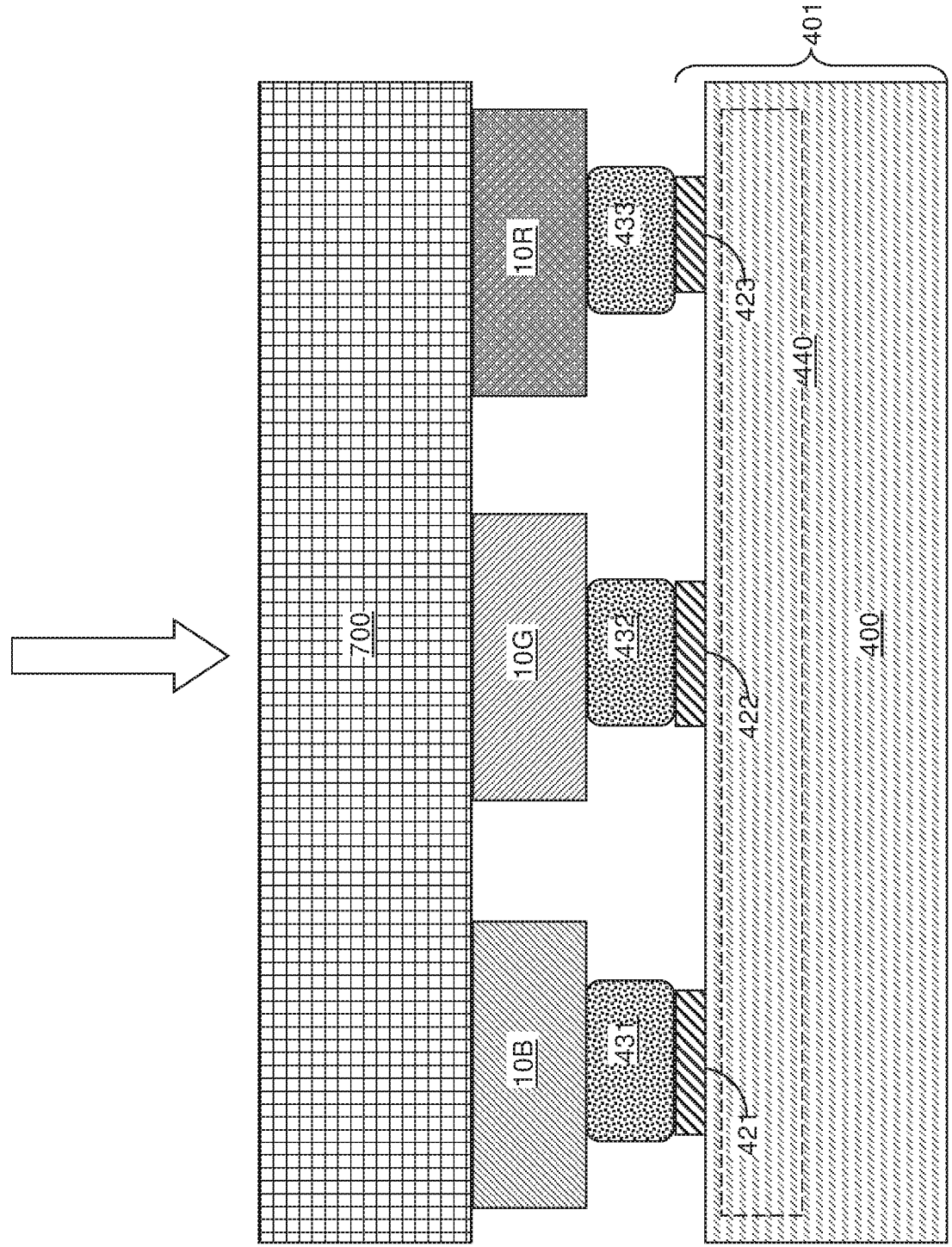
Figure 16O:
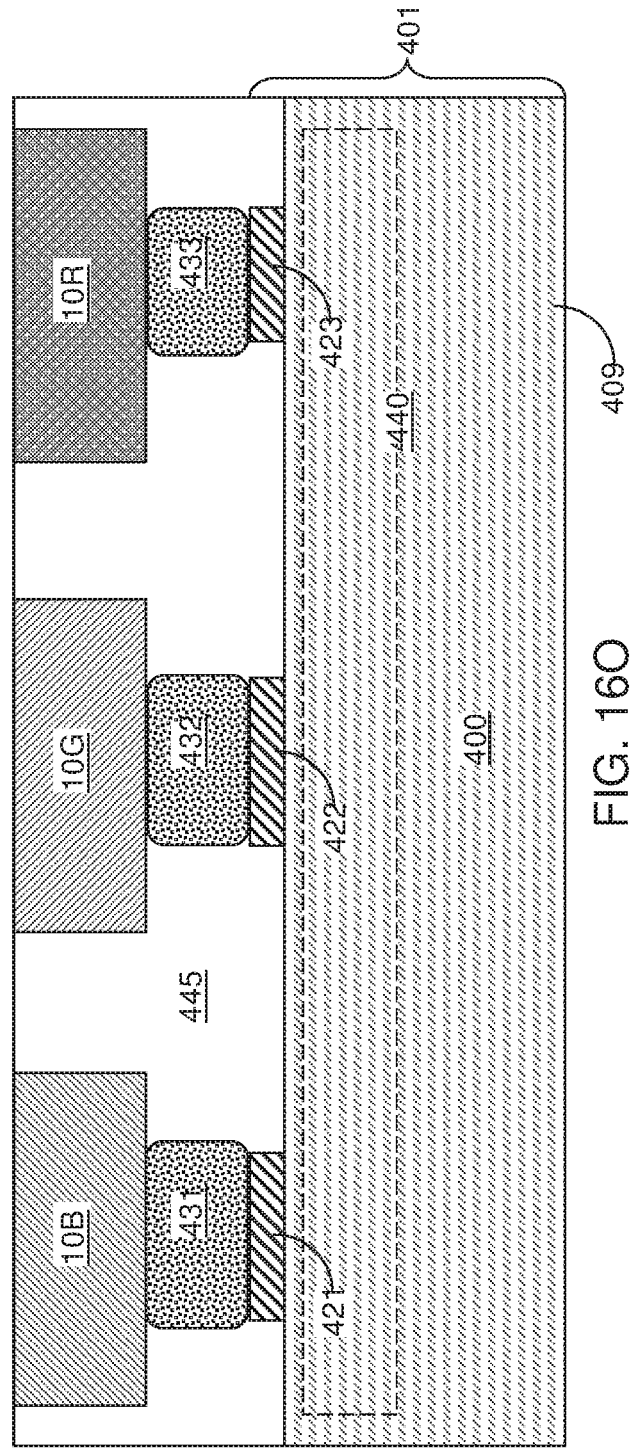
Figure 16P:
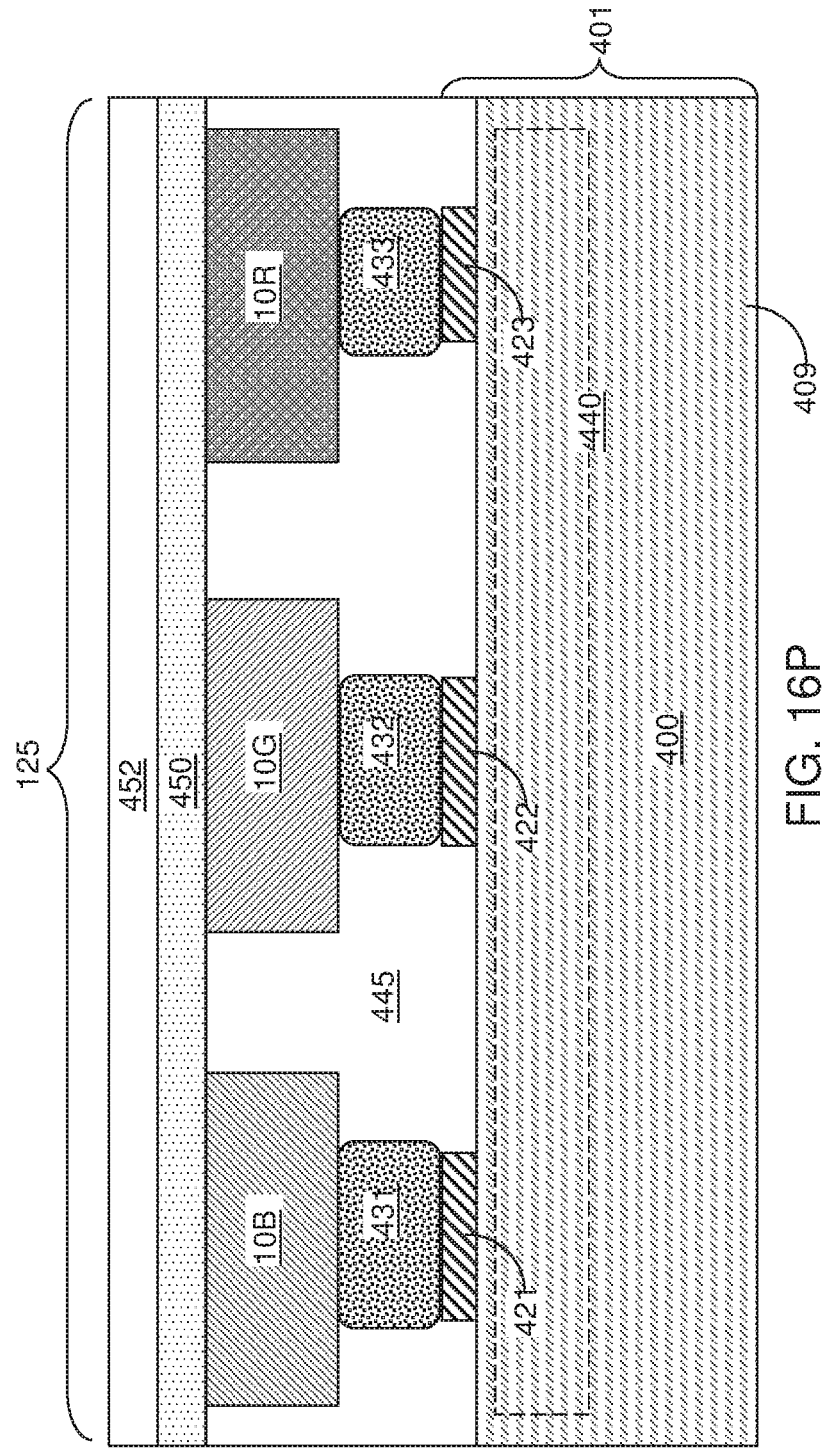

FIGS. 16A-16P illustrate a method of incorporating the LEDs 10, such as a blue, green and/or red light emitting subpixels (10B, 10G, 10R) into a single pixel of direct view display from different growth substrates 20 shown in FIG. 1B. The LEDs 10 can be the nanostructure LEDs described above, different nanostructure LEDs and/or bulk (i.e., planar) LEDs. Each of the pixels comprises a red-light emitting diode 10R configured to emit light at a peak wavelength in a range from 620 nm to 750 nm, a green-light emitting diode 10G configured to emit light at a peak wavelength in a range from 495 nm to 570 nm, and a blue-light emitting diode 10B configured to emit light at a peak wavelength in a range from 450 to 495 nm.

Referring to FIG. 16A, an in-process structure is illustrated, which can be employed to form an exemplary light emitting device assembly (e.g., direct view display) according to an embodiment of the present disclosure. In this embodiment, the backplane substrate 400 may have a substantially planar (i.e., not stepped) upper surface or a stepped upper surface. The bond pads (421, 422, 423) can have the same height or different heights. The conductive bonding structures (431, 432, 433) can have the same height or different heights. The exemplary light emitting device assembly can include the same thickness bonding pads (421, 422, 423) for the respective first, second and third LEDs (10B, 10G, 10R) and the same height for the conductive bonding structures (431, 432, 433). The bond pads (421, 422, 423) can have the same or different composition as each other. The conductive bonding structures (431, 432, 433) can have the same or different composition as each other.

In one embodiment, the conductive bonding structures (431, 432, 433) can be formed on the LEDs 10 to be transferred to the backplane 401. For example, first light emitting diodes 10B can be the first devices to be transferred to the backplane substrate 400. The first light emitting diodes 10B can be located on first support substrate 22, which can be a first transfer substrate or a first-type growth substrate. The conductive bonding structures 431 are formed on a first subset of the first light emitting diodes 10B, for example as described above and include the conductive bonding structure 431. The second conductive bonding structures 432 are formed on a second subset of the first light emitting diodes 10B and the third conductive bonding structures 433 are formed on a third subset of the first light emitting diodes 10B.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 0.25 microns to 100 microns (such as from 0.5 microns to 1 micron), although lesser and greater maximum horizontal dimensions can also be employed.

Referring to FIG. 16B, the backplane 401 and the assembly including the first light emitting diodes 10B are positioned such that each conductive bonding structure 431 is attached to one first LED 10B, and contacts the respective bonding pad 421. Each second conductive bonding structure 432 can be attached to another first LED 10B and contacts the second bonding pad 422. Each third conductive bonding structure 433 is attached to yet another first LED 10R and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first LEDs 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first LED 10B and to an underlying first bonding pad 421. Preferably, the laser beam is provided through the support substrate 22. The laser beam may be transmitted through the support substrate 22 and through the devices to the conductive reflector layer 82 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Referring to FIG. 16C, a laser irradiation process is performed to separate each bonded first LED 10B from the first support substrate. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes 10B). The ablation material layer 130 may comprise the semiconductor buffer layer 24 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first LED 10B.

Referring to FIG. 16D, the assembly of the first support substrate 22 and attached first light emitting diodes 10B (i.e., the complement of the first subset of the first light emitting diodes 10B) is separated from the backplane 401 and the first subset of the first light emitting diodes 10B.

Referring to FIG. 16E, a dummy substrate 700 can employed to push the first light emitting diodes 10B on the first conductive bonding structures 431 toward the backplane 401 while optionally thermally reflowing the first conductive bonding structures 431. The compressible first conductive bonding structures can be compressed by 5 to 20% of their thickness during this step.

Referring to FIG. 16F, a second support substrate (such as a second growth or transfer substrate) 22G from which a first subset of second LEDs 10G are removed is positioned over the in-process exemplary light emitting device assembly, and is aligned such that a second subset of the second light emitting diodes 10G overlies the second bonding pads 422.

Referring to FIG. 16G, the backplane 401 and the assembly including the second light emitting diodes 10G are positioned such that each second conductive bonding structure 432 is attached to the second LED 10G and contacts the second bonding pad 422.

In one embodiment, each second conductive bonding structure 432 can be attached to one of an overlying second LED 10G, and the second bonding pad 422, and each third conductive bonding structure 433 can be attached to one of an overlying second LED 10G and contacts the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second LEDs 10G). The same heating laser can be employed as in the processing steps of FIG. 16B. The second conductive bonding structures 432 can be sequentially irradiated by a laser beam from the heating laser 467 to reflow each second conductive bonding structure 432, and to bond each second conductive bonding structure 432 to an overlying second LED 10G and to an underlying second bonding pad 422.

Referring to FIG. 16H, a laser irradiation process is performed to separate each bonded second LED 10G from the second support substrate. The wavelength of the laser 477 can be different from the wavelength of the heating laser 467, and provides more heating to the material of the ablation material layer 130 than to the materials of the support substrate 22G and the transferred devices (e.g., the second light emitting diodes 10G). Each portion of the ablation material layer 130 overlying the second conductive bonding structures 432 can be sequentially irradiated by a laser beam from the laser 477 to dissociate each underlying second LED 10G.

Referring to FIG. 16I, the assembly of the second support substrate 22G and attached second light emitting diodes 10G (a third subset of the second light emitting diodes 10G that remain on the second support substrate) is separated from the backplane 401 and the second subset of the second light emitting diodes 10G that are now attached to the backplane 401.

Referring to FIG. 16J, a dummy substrate 700 can employed to push the second light emitting diodes 10G on the second conductive bonding structures 432 toward the backplane 401 in the same manner as described above.

Referring to FIG. 16K, a third support substrate (such as a third transfer substrate 22R), from which a first subset and a second subset of third LEDs 10R have been removed in prior processing steps, is positioned over the in-process fourth exemplary light emitting device assembly, and is aligned such that a third subset of the third light emitting diodes 10R overlies the third bonding pads 423.

Referring to FIG. 16L, the backplane 401 and the assembly including the third light emitting diodes 10R are positioned such that each third conductive bonding structure 433 is attached a third LED 10R and contacts the third bonding pad 423. If any addition conductive bonding structures (not shown) are present, additional conductive bonding structures (not shown) overlying such additional bonding pads can contact underlying additional bonding pads and overlying third LEDs 10R, and can be attached to the underlying additional bonding pads or to the overlying third LEDs 10R.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third LEDs 10R). The same heating laser can be employed as in the processing steps of FIG. 16B or FIG. 16G. The third conductive bonding structures 433 can be sequentially irradiated by a laser beam from the heating laser 467 to reflow each third conductive bonding structure 433, and to bond each third conductive bonding structure 433 to an overlying third LED 10R and to an underlying third bonding pad 423.

Referring to FIG. 16M, a laser irradiation process is performed to separate each bonded third LED 10R from the third support substrate in the same manner as in the processing steps of FIG. 15A.

Referring to FIG. 16N, a dummy substrate 700 may be employed to push the third light emitting diodes 10R on the third conductive bonding structures 433 toward the backplane 401. The assembly of the third support substrate 22R and any remaining third light emitting diodes 10R, if any, is separated from the backplane 401 and the third subset of the third light emitting diodes 10R that are now attached to the backplane 401 in the same manner as above. The first, second and third LEDs (10B, 10G, 10R) attached to the backplane 401 have co-planar top and bottom surfaces (e.g., top surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Referring to FIG. 16O, the dielectric matrix 445 illustrated in FIG. 15A can be applied in the spaces between the light emitting diode subpixels (10B, 10G, 10R) that are bonded to the backplane 401. While FIG. 16O illustrates only three subpixels (10B, 10G, 10R), it is understood that an array of pixels is formed on the backplane 401, and each pixel includes a set of light emitting diodes such as a blue-light emitting diode as a first LED subpixel 10B, a green-light emitting diode as a second LED subpixel 10G, and a red-light emitting diode as a third LED subpixel 10R. The dielectric matrix 445 can laterally surround each of the red-light emitting diodes, the green-light emitting diodes, and the blue light emitting diodes within the array of pixels.

The dielectric matrix 445 can include a self-planarizing dielectric material such as spin-on glass (SOG) or polymer, or can be planarized by a recess etch or chemical mechanical planarization. The top surface of the dielectric matrix 445 as planarized can be within the horizontal plane including the top surfaces of the subpixels (10B. 10G, 10R), or can be vertically recessed below the horizontal plane including the top surfaces of the subpixels (10B. 10G, 10R).

Referring to FIG. 16P, a front side transparent conductive oxide layer 450 can be formed over the dielectric matrix 445 and directly on the electrical nodes that are located on top of each subpixel (10B, 10G, 10R). For example, the front side transparent conductive oxide layer 450 can be deposited on the semiconductor buffer layer 24 or directly on the compound semiconductor material layer 26 of the first conductivity type. For example, if the buffer layer 24 has a high resistivity and is not removed during the laser ablation step described above, then an additional etch back or CMP is performed to remove the buffer layer 24 and expose the doped compound semiconductor layer 26 of the first conductivity type.

In this case, the front side transparent conductive oxide layer 450 can be a common ground electrode for each of the red-light emitting diode subpixels 10R, the green-light emitting diode subpixels 10G, and the blue-light emitting diode subpixels 10B. The subpixels 10R, 10B, 10G form a pixel 125 of a direct view display device 500.

An optional transparent passivation dielectric layer 452 can be formed over the front side transparent conductive oxide layer 450. The transparent passivation dielectric layer 452 can include silicon nitride or silicon oxide. Thus, the LED subpixels 10B, 10G and 10R are so-called bottom emitting, vertical LEDs 10 which emit light through the compound semiconductor material layer 26, the front side transparent conductive oxide layer 450 and transparent passivation dielectric layer 452. The LEDs are vertical devices because they have electrical contacts (i.e., layer 450 and bonding structures or pads (431, 432, 433)) on opposite sides thereof.

According to various embodiments of the present disclosure, a light emitting device (LED) is provided, which comprises: a substrate 20 including a doped compound semiconductor layer 26; a growth mask layer 42 located on a top surface of the doped compound semiconductor layer 26 and including openings 43 therethrough; a plurality of semiconductor nanostructures 32 located on the growth mask layer 43 and having a doping of a first conductivity type, wherein each of the plurality of semiconductor nanostructures 32 includes a respective nanofrustum 32F including a bottom surface, a top surface, tapered planar sidewalls, and a height that is less than a maximum lateral dimension TMLD of the top surface, and a respective pillar portion 32X contacting the bottom surface of the nanofrustum 32F and located within a respective one of the openings 43 through the growth mask layer 42; a plurality of active regions 34, wherein each of the plurality of active regions 34 is located on a respective one of the nanofrustums 32F and includes an optically active compound semiconductor layer stack configured to emit light; and a second conductivity type semiconductor material layer 36 having a doping of a second conductivity type and located on each of the plurality of active regions 34.

In one embodiment, each of the tapered planar sidewalls includes a respective crystallographic p-plane. In one embodiment, each of the nanofrustums 32F is a hexagonal nanofrustum.

In one embodiment, the ratio of a maximum lateral dimension TMLD of the top surface to the maximum lateral dimension BMLD of the bottom surface is in a range from 0.3 to 0.9 for each of the nanofrustums 32F. In one embodiment, the ratio of the height to the maximum lateral dimension TMLD of the top surface is in a range from 0.05 to 0.5 for each of the nanofrustums 32F. In one embodiment, the ratio of the maximum dimension of the pillar portion 32X to the height of the nanofrustum 32F is in a range from 0.02 to 0.5 for each of the plurality of semiconductor nanostructures 32.

In one embodiment, the nanofrustums 32F are arranged in clusters 44 as two-dimensional arrays. A fill factor of the openings 43 in each cluster 44 is at least 10% and a fill factor of the nanofrustums 32F in each cluster 44 is at least 40%. A height of each nanofrustum is less than 200 nm and a width of each nanofrustum is 200 nm to 500 nm.

In one embodiment, each of the plurality of active regions 34 includes a top planar portion having a first thickness t1 and sidewall portions overlying tapered planar sidewalls of a respective one of the nanofrustums 32F and having a second thickness t2, wherein the ratio of the first thickness t1 to the second thickness t2 is in a range from 2 to 50.

In one embodiment, the light emitting device can further comprise: a top contact electrode 50 that is electrically shorted to the second conductivity type semiconductor material layer 36; a dielectric material layer 60 located over the second conductivity type semiconductor material layer 38 and the top contact electrode 50 and including an opening therein; a reflector layer 70 located over the dielectric material layer 60 including an opening and including sidewall portions that laterally surround the second conductivity type semiconductor material layer 38 and the doped compound semiconductor layer 26; and a conductive bonding structure 431 located within the opening through the reflector layer 70, within the opening through the dielectric material layer 60, and contacting the top contact electrode 50.

According to an aspect of the present disclosure, a direct view display device is provided, which comprises: a plurality of LEDs (10R, 10G, 10B) of the present disclosure; and a backplane 401 comprising metal interconnect structures 440 therein or thereupon; wherein each of the plurality of LEDs (10R, 10G, 10B) is electrically connected to a respective one of the metal interconnect structures 440 and constitutes a first subpixel which emits light at a first peak wavelength of a respective pixel of the direct view display device. In one embodiment, the respective pixel further comprises: a second subpixel comprising a second LED which emits light at a second peak wavelength different from the first peak wavelength; and a third subpixel comprising a third LED which emits light at a third peak wavelength different from the first and the second peak wavelengths.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device (LED), comprising:
a substrate including a doped compound semiconductor layer;
a growth mask layer located on a top surface of the doped compound semiconductor layer and including openings therethrough;
a plurality of semiconductor nanostructures located on the growth mask layer and having a doping of a first conductivity type, wherein each of the plurality of semiconductor nanostructures includes a respective nanofrustum including a bottom surface, a top surface, tapered planar sidewalls, and a height that is less than a maximum lateral dimension of the top surface, and a respective pillar portion contacting the bottom surface of the nanofrustum and located within a respective one of the openings through the growth mask layer;
a plurality of active regions, wherein each of the plurality of active regions is located on a respective one of the nanofrustums and includes an optically active compound semiconductor layer stack configured to emit light;
a second conductivity type semiconductor material layer having a doping of a second conductivity type and located on each of the plurality of active regions; and
at least one feature comprising:
(a) a first feature wherein each of the tapered planar sidewalls includes a respective crystallographic p-plane;
(b) a second feature wherein the nanofrustums are arranged in clusters as two-dimensional arrays and wherein a fill factor of the openings in each cluster is at least 10%;
(c) a third feature wherein each of the plurality of active regions includes a top planar portion having a first thickness and sidewall portions overlying tapered planar sidewalls of a respective one of the nanofrustums and having a second thickness, wherein a ratio of the first thickness to the second thickness is in a range from 2 to 50; or
(d) a fourth feature comprising:
a top contact electrode that is electrically shorted to the second conductivity type semiconductor material layer;
a dielectric material layer located over the second conductivity type semiconductor material layer and the top contact electrode and including an opening therein;
a reflector layer located over the dielectric material layer including an opening and including sidewall portions that laterally surround the second conductivity type semiconductor material layer and the doped compound semiconductor layer; and
a conductive bonding structure located within the opening in the reflector layer and the dielectric material layer, and contacts the top contact electrode.

2. The light emitting device of claim 1, wherein the at least one feature comprises the first feature.

3. The light emitting device of claim 1, wherein each of the nanofrustums is a hexagonal nanofrustum.

4. The light emitting device of claim 1, wherein a ratio of a maximum lateral dimension of the top surface to a maximum lateral dimension of the bottom surface is in a range from 0.3 to 0.9 for each of the nanofrustums.

5. The light emitting device of claim 1, wherein the nanofrustums are arranged in clusters as two-dimensional arrays.

6. The light emitting device of claim 1, wherein the at least one feature comprises the second feature.

7. The light emitting device of claim 6, wherein a fill factor of the nanofrustums in each cluster is at least 40%.

8. The light emitting device of claim 7, wherein a height of each nanofrustum is less than 200 nm and a width of each nanofrustum is 200 nm to 500 nm.

9. The light emitting device of claim 1, wherein the at least one feature comprises the third feature.

10. The light emitting device of claim 1,
wherein the at least one feature comprises the fourth feature.

11. A direct view display device, comprising:
a plurality of LEDs of claim 1; and
a backplane comprising metal interconnect structures therein or thereupon;
wherein each of the plurality of LEDs is electrically connected to a respective one of the metal interconnect structures and constitutes a first subpixel which emits light at a first peak wavelength of a respective pixel of the direct view display device.

12. The direct view display device of claim 11, wherein the respective pixel further comprises:
a second subpixel comprising a second LED which emits light at a second peak wavelength different from the first peak wavelength; and
a third subpixel comprising a third LED which emits light at a third peak wavelength different from the first and the second peak wavelengths.

13. A method of forming a light emitting device, comprising:
forming a growth mask layer including openings therethrough on a top surface of a doped compound semiconductor layer in a substrate;
forming a plurality of semiconductor nanostructures having a doping of a first conductivity type through, and over, the growth mask layer, wherein each of the plurality of semiconductor nanostructures includes a nanofrustum including a bottom surface, a top surface, tapered planar sidewalls, and a height that is less than a maximum lateral dimension of the top surface, and a pillar portion contacting the bottom surface of the nanofrustum and located within a respective one of the openings through the growth mask layer;
forming a plurality of active regions on the nanofrustums, wherein each of the plurality of active regions includes a respective optically active compound semiconductor layer stack configured to emit light;
forming a second conductivity type semiconductor material layer having a doping of a second conductivity type on each of the plurality of active regions: and
at least one feature comprising:
(a) a first feature wherein:
each of the tapered planar sidewalls includes a respective crystallographic p-plane; and
each of the nanofrustums is a hexagonal nanofrustum;
(b) a second feature wherein:
the nanofrustums are arranged in clusters as two-dimensional arrays: a fill factor of the openings in each cluster is at least 10%: a fill factor of the nanofrustums in each cluster is at least 40%; and
a height of each nanofrustum is less than 200 nm and a width of each nanofrustum is 200 nm to 500 nm;
(c) a third feature comprising:
forming a plurality of in-process semiconductor nanostructures through, and over, the growth mask layer, wherein each of the plurality of in-process semiconductor nanostructures includes a respective nanopyramid including a bottom surface, an apex, and tapered planar sidewalls adjoining the apex, and a respective one of the pillar portions contacting the bottom surface of the respective nanopyramid;
etching top portions of the nanopyramids employing an anisotropic etch process; and
converting the remaining portions of the nanopyramids into the nanofrustums employing an anneal process that induces rearrangement of a material of the remaining portions of the nanopyramids at least through surface diffusion, wherein the anisotropic etch process comprises an inductively coupled plasma etch process;
(d) a fourth feature comprising:
forming a plurality of in-process semiconductor nanostructures through, and over, the growth mask layer, wherein each of the plurality of in-process semiconductor nanostructures includes a respective nanopyramid including a bottom surface, an apex, and tapered planar sidewalls adjoining the apex, and a respective one of the pillar portions contacting the bottom surface of the respective nanopyramid; and
converting the nanopyramids into the nanofrustums employing an anneal process that induces rearrangement of a material of the nanopyramids at least through surface diffusion;
(e) a fifth feature wherein:
the pillar portions and the nanofrustums are formed by growing a compound semiconductor material from physically exposed surfaces of the doped compound semiconductor layer underneath the openings in the growth mask layer;
the nanofrustums are arranged in clusters;
a fill factor of the openings in each cluster is at least 10%; and
a height of each nanofrustum is less than 200 nm; or
(f) a sixth feature comprising:
forming a top contact electrode over the second conductivity type semiconductor material layer, wherein the top contact electrode is electrically shorted to the second conductivity type semiconductor material layer;
forming a dielectric material layer including an opening therein over the second conductivity type semiconductor material layer and the top contact electrode;
forming a reflector layer located including an opening over the dielectric material layer, wherein the reflector layer includes sidewall portions that laterally surround the second conductivity type semiconductor material layer and a portion of the doped compound semiconductor layer;
forming a conductive bonding structure within the opening in the reflector layer and the dielectric material layer, and on the top contact electrode;
attaching the conductive bonding structure to a direct view display device backplane; and
using laser lift off to remove the light emitting device from the substrate.

14. The method of claim 13, wherein the at least one feature comprises the first feature.

15. The method of claim 13, wherein the at least one feature comprises the second feature.

16. The method of claim 13, further comprising:
forming a plurality of in-process semiconductor nanostructures through, and over, the growth mask layer, wherein each of the plurality of in-process semiconductor nanostructures includes a respective nanopyramid including a bottom surface, an apex, and tapered planar sidewalls adjoining the apex, and a respective one of the pillar portions contacting the bottom surface of the respective nanopyramid; and etching top portions of the nanopyramids employing an anisotropic etch process.

17. The method of claim 13, wherein the at least one feature comprises the third feature.

18. The method of claim 13, wherein the at least one feature comprises the fourth feature.

19. The method of claim 13, wherein the at least one feature comprises the fifth feature.

20. The method of claim 13, wherein the at least one feature comprises the sixth feature.

\* \* \* \* \*